United States Patent
Rabkin et al.

(10) Patent No.: US 10,923,196 B1
(45) Date of Patent: Feb. 16, 2021

(54) ERASE OPERATION IN 3D NAND

(71) Applicant: SanDisk Technologies LLC, Addison, TX (US)

(72) Inventors: Peter Rabkin, Cupertino, CA (US); Kwang-Ho Kim, Pleasanton, CA (US); Masaaki Higashitani, Cupertino, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/781,589

(22) Filed: Feb. 4, 2020

(51) Int. Cl.
| G11C 16/04 | (2006.01) |
| G11C 16/14 | (2006.01) |
| G11C 16/24 | (2006.01) |
| H01L 27/06 | (2006.01) |
| G11C 16/34 | (2006.01) |

(52) U.S. Cl.
CPC .......... *G11C 16/14* (2013.01); *G11C 16/0483* (2013.01); *G11C 16/24* (2013.01); *G11C 16/3427* (2013.01); *G11C 16/3445* (2013.01); *H01L 27/0688* (2013.01)

(58) Field of Classification Search
CPC . G11C 16/14; G11C 16/0483; G11C 16/3427; G11C 16/24; G11C 16/3445; H01L 27/0688
USPC .................................................. 365/185.29
See application file for complete search history.

(56) References Cited

U.S. PATENT DOCUMENTS

| 7,269,070 | B2 | 9/2007 | Kim |
| 7,764,563 | B2* | 7/2010 | Tanzawa ................ G05F 1/575 365/226 |
| 8,400,212 | B1 | 3/2013 | Nguyen et al. |
| 9,019,775 | B2 | 4/2015 | Costa et al. |
| 9,164,526 | B2 | 10/2015 | Pan et al. |
| 9,424,940 | B1* | 8/2016 | Choo ....................... G11C 7/04 |
| 9,683,904 | B2 | 6/2017 | Matsumoto et al. |
| 9,786,378 | B1 | 10/2017 | Zhang et al. |
| 9,830,963 | B1 | 11/2017 | Pang et al. |
| 9,922,714 | B1* | 3/2018 | Yu ....................... G11C 16/0483 |
| 10,490,278 | B2* | 11/2019 | Kimura .................... G11C 7/06 |

(Continued)

FOREIGN PATENT DOCUMENTS

CN      105957554 A      9/2016

OTHER PUBLICATIONS

U.S. Appl. No. 16/182,031, filed Nov. 6, 2018.

(Continued)

*Primary Examiner* — Xiaochun L Chen

(74) *Attorney, Agent, or Firm* — Vierra Magen Marcus LLP

(57) ABSTRACT

An apparatus for erasing non-volatile storage elements in a non-volatile memory system is disclosed. The apparatus has consistent speed in gate induced drain leakage (GIDL) erase across the operating temperature of the memory system. In one aspect, a voltage source outputs an erase voltage to NAND strings. The NAND strings may draw a GIDL erase current in response to the erase voltage. The amount of GIDL erase current for a given erase voltage is highly temperature dependent. The GIDL erase current may be sampled, and the erase voltage regulated based on the GIDL erase current. Therefore, the GIDL erase current, as well as erase speed, may be kept uniform across operating temperatures.

19 Claims, 19 Drawing Sheets

(56) References Cited

U.S. PATENT DOCUMENTS

| | | | |
|---|---|---|---|
| 2007/0139099 A1 | 6/2007 | Pan | |
| 2010/0128551 A1* | 5/2010 | Tanzawa | G05F 1/575 |
| | | | 365/226 |
| 2019/0287618 A1* | 9/2019 | Kimura | G11C 16/16 |

OTHER PUBLICATIONS

U.S. Appl. No. 16/233,780, filed Dec. 27, 2018.
U.S. Appl. No. 16/400,280, filed May 1, 2019.
U.S. Appl. No. 16/540,862, filed Aug. 14, 2019.

* cited by examiner

ERASE OPERATION IN 3D NAND

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

One type of non-volatile memory has strings of non-volatile memory cells that have a select transistor at each end of the string. Typically, such strings are referred to as NAND strings. A NAND string may have a drain side select transistor at one end that connects the string to a bit line. A NAND string may have a source side select transistor at one end that connects the string to a source line. The non-volatile memory cells may also be referred to as non-volatile memory cell transistors, with the channels of the non-volatile memory cell transistors collectively being referred to as a NAND string channel.

BRIEF DESCRIPTION OF THE DRAWINGS

Like-numbered elements refer to common components in the different figures.

DETAILED DESCRIPTION

Figure 1:
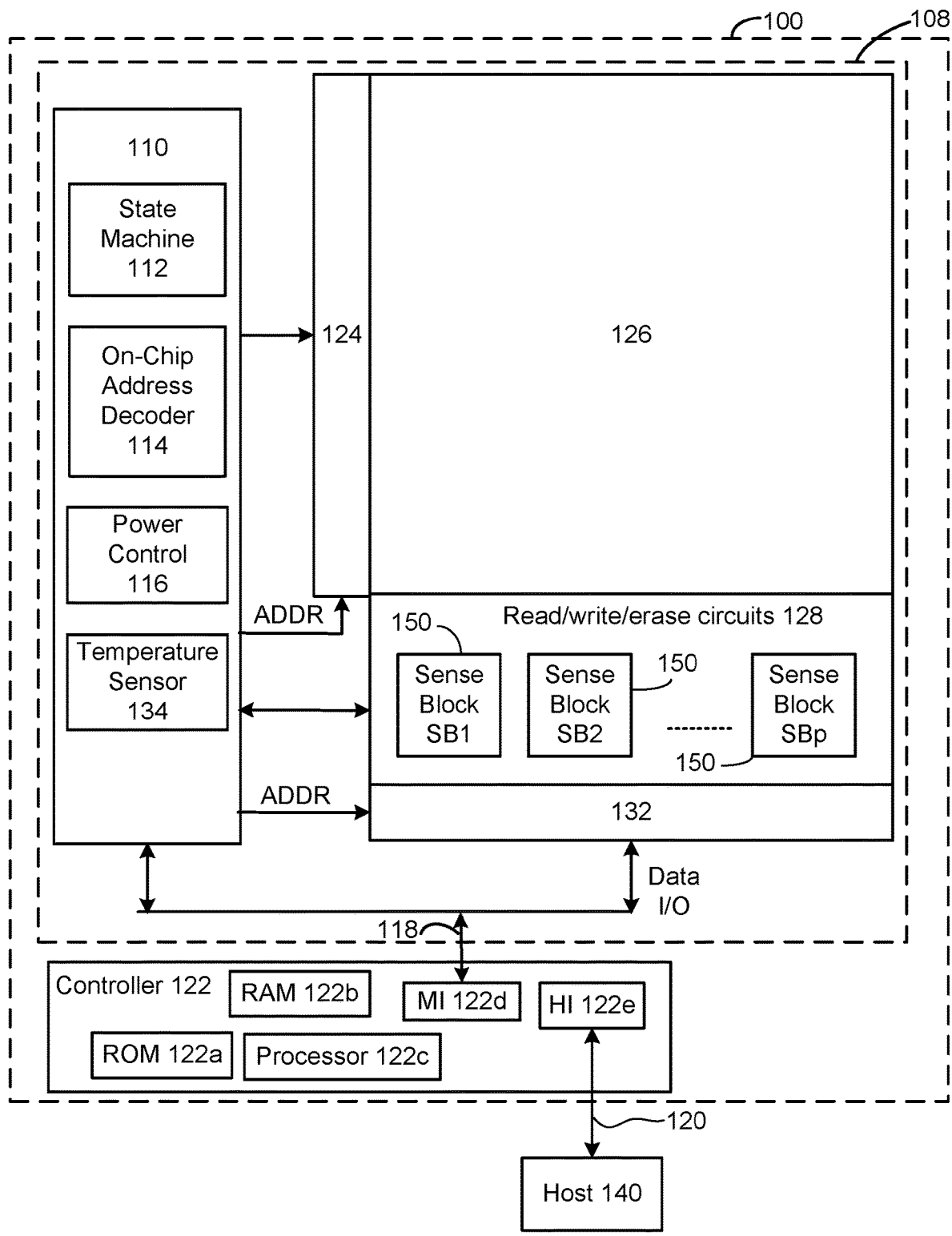
FIG. 1 is a functional block diagram of a memory device.

Techniques are provided for erasing non-volatile storage elements in a non-volatile memory system. Techniques are provided to erase a NAND string in a 3D memory device, in one embodiment. Technology is disclosed herein for efficient gate induced drain leakage (GIDL) erase of non-volatile memory cells. Technology is disclosed herein for consistent speed in GIDL erase across the operating temperature of the memory system.

One technique to erase memory cells in some memory systems is to bias a p-well substrate to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells. Herein, this is referred to as a GIDL erase. Both a p-well erase and a GIDL erase may be used to lower the threshold voltage (Vt) of memory cells.

The GIDL current is generated by causing a drain-to-gate voltage at a select transistor of a NAND string, in one embodiment. A transistor drain-to-gate voltage that generates a GIDL current is referred to herein as a GIDL erase voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, moving into the NAND channel, thereby raising the potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the Vt of the memory cells.

The GIDL current may be generated at either end of the NAND string. A first GIDL erase voltage may be created between two terminals of a select transistor (e.g., drain side select transistor) that is connected to a bit line to generate a first GIDL current. A second GIDL erase voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. After the GIDL erase voltage is applied, the Vt of the memory cells may be tested to determine whether the Vt is below an erase verify voltage level. If not, one or more additional GIDL erase voltages may be applied and the memory cells re-tested.

The amount of GIDL current that is generated for a given GIDL erase voltage is temperature dependent. In general, GIDL current goes up as temperature increases. In some cases, the GIDL current could increase by a factor of about ten from 30 degrees Celsius (30 C) to 90 C. Erase speed may depend on the amount of GIDL current. The erase speed may be quantified by the amount by which the Vt decreases per GIDL erase voltage pulse or by the number of GIDL erase voltage pulses that are needed to fully erase the memory cells.

It is possible for a GIDL erase to be much more temperature dependent than the aforementioned p-well erase. In some embodiments, the magnitude of the GIDL erase voltage applied by the memory system is temperature dependent. For example, the memory system may regulate the magnitude of the GIDL erase voltage such that it decreases with increasing temperature. A temperature dependent GIDL erase voltage may provide consistent GIDL current across the operating temperature of the memory system. A temperature dependent GIDL erase voltage may provide consistent erase speed across the operating temperature.

In some embodiments, the memory system provides a target GIDL current to the NAND strings being erased. In one embodiment, the memory system provides the target GIDL current independent of temperature. Providing a target GIDL current provides for a consistent erase speed. Thus, the memory system may achieve a consistent erase speed across the operating temperature.

During GIDL erase, there may be parasitic leakage current. For example, there may be leakage current associated with interconnects and transistors that are used to provide the GIDL erase voltage to the NAND strings. Such parasitic leakage current may be temperature dependent. The parasitic leakage current may increase as the temperature increases. In some embodiments, the parasitic leakage current is mitigated to provide consistent erase speed across the operating temperature of the memory system.

FIG. 1-FIG. 7 describe one example of a memory system that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write/erase circuits 128. Memory structure 126 is addressable by word lines via a row decoder 124 and by bit lines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write/erase circuits 128 to perform memory operations (e.g., write, read, erase and others) on memory structure 126, and includes state machine 112, an on-chip address decoder 114, a power control circuit 116, and a temperature sensor 134. In one embodiment, control circuitry 110 includes buffers such as registers, ROM fuses and other storage devices for storing default values such as base voltages and other parameters. In one embodiment, the state machine 112 is programmable by software. In other embodiments, the state machine does not use software and is completely implemented in hardware (e.g., electrical circuits). The temperature sensor 134 can detect a temperature of the memory device at the time of an erase operation, as well as other operations.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The sense blocks may include sense amplifiers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
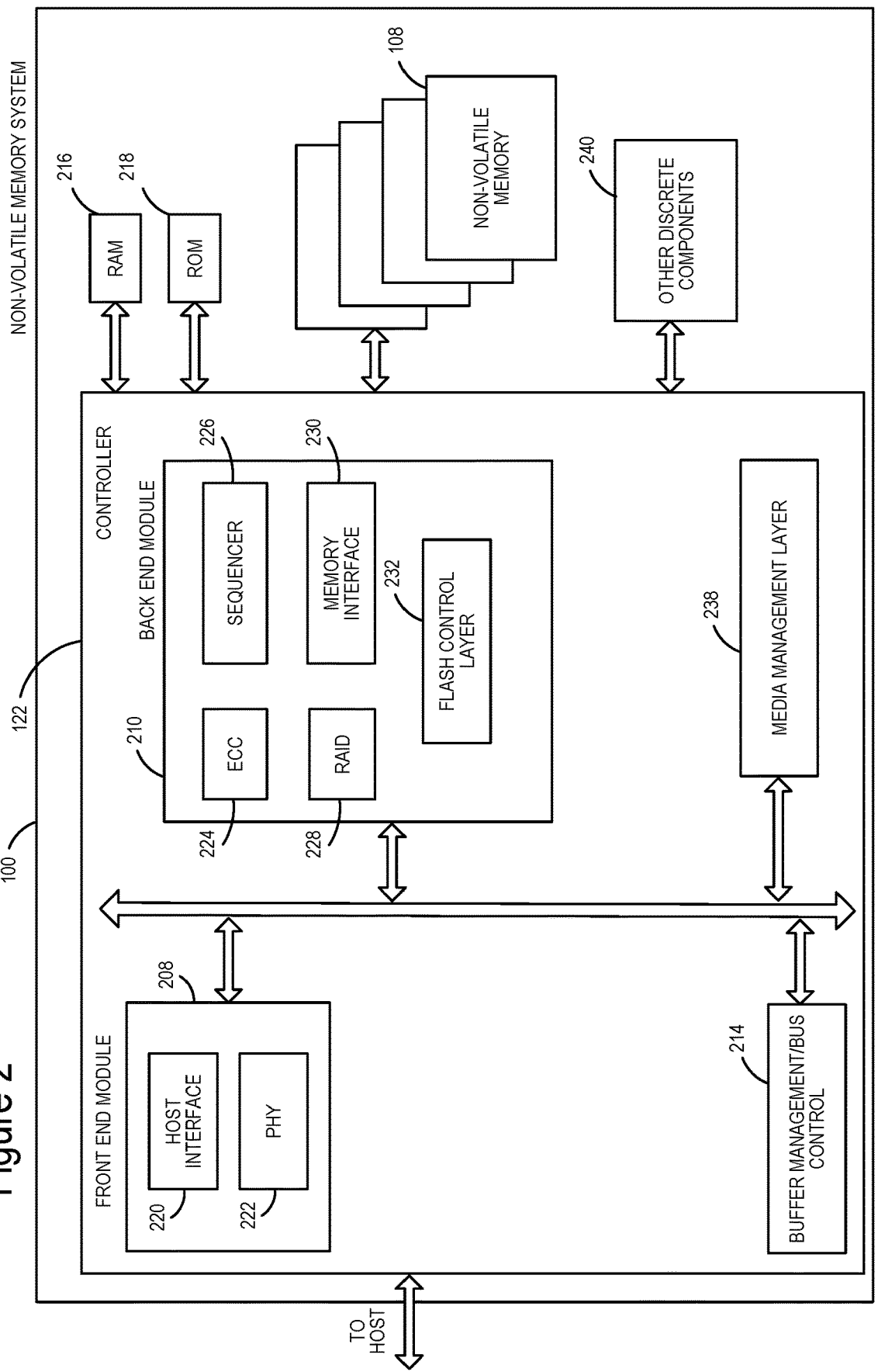
FIG. 2 is a block diagram depicting one embodiment of a memory system.

FIG. 2 is a block diagram of example memory system 100, depicting more details of one embodiment of controller 122. The controller in FIG. 2 is a flash memory controller, but note that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block. The MML 238 understands these potential limitations of the memory 126 which may not be visible to the host. Accordingly, the MML 238 attempts to translate the writes from host into writes into the memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
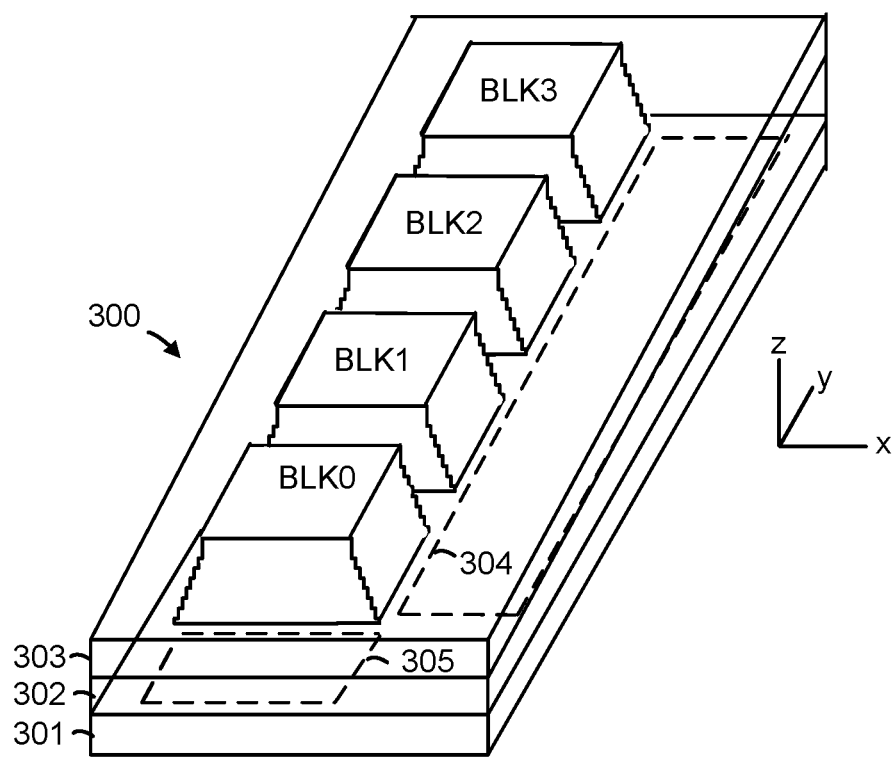
FIG. 3 is a perspective view of a memory system.

FIG. 3 is a perspective view of a memory device 300 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The substrate has a major surface that extends in the x-y plane. The blocks may be formed over the major surface. The peripheral area 304 runs along an edge of each block while the peripheral area 305 is at an end of the set of blocks. Each peripheral area can include circuitry, including but not limited to voltage drivers which can be connected to control gate layers, bit lines and source lines of the blocks.

The substrate 301 can also carry circuitry under the blocks, along with one or more lower metal layers which are patterned in conductive paths to carry signals of the circuitry. The blocks are formed in an intermediate region 302 of the memory device. In an upper region 303 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 4:
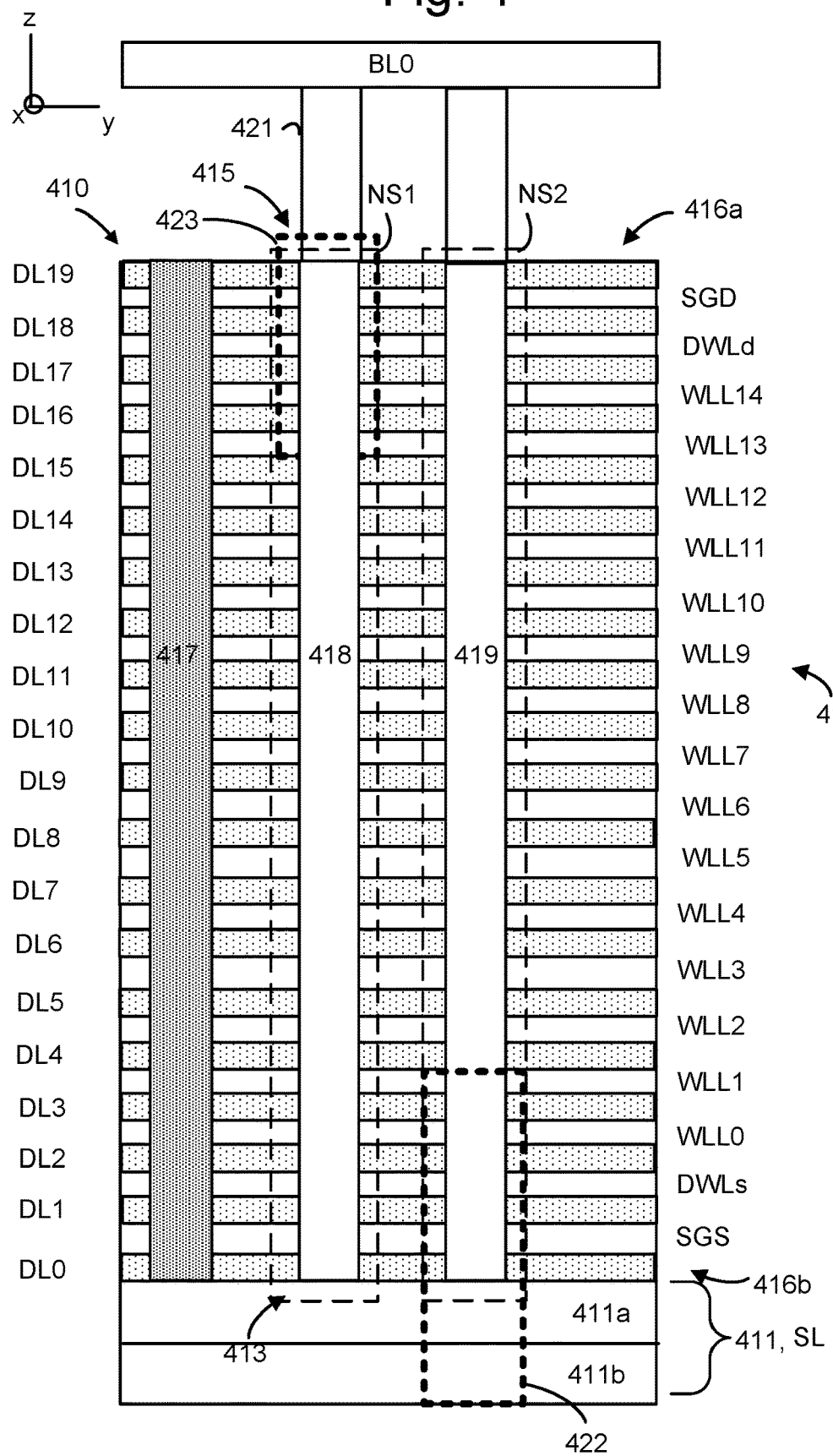
FIG. 4 depicts an example cross-sectional view of a portion of one of the blocks of FIG. 3.

FIG. 4 depicts an example cross-sectional view of a portion of one of the blocks of FIG. 3. The block comprises a stack 410 of alternating conductive and dielectric layers. In this example, the conductive layers comprise SGD layer, SGS layers, dummy word line layers (or word lines) DWLd, DWLs, in addition to data word line layers (or word lines) WLL0-WLL14. The dielectric layers are labelled as DL0-DL19. Further, regions of the stack which comprise NAND strings NS1 and NS2 are depicted. Each NAND string encompasses a memory hole 418 or 419 which is filled with materials which form memory cells adjacent to the word lines. A region 422 of the stack is shown in greater detail in FIG. 6A. A region 423 of the stack is shown in greater detail in FIG. 6B. Note that there may be more or fewer SGD layers, SGS layers, dummy word line layers, and data word line layers.

Underneath the stack is a source line (SL) 411. In one approach, a portion of the source line SL comprises a polysilicon layer 411a which is in contact with a source end of each string of memory cells in a block. The polysilicon layer 411a is in electrical contact with the NAND string channel (not shown in FIG. 4). The polysilicon layer 411a is in contact with a metal 411b (e.g., tungsten) layer. The source line 411 may be shared by all of the blocks in a plane, in one approach.

NS1 has a source-end 413 at a bottom 416b of the stack 416 and a drain-end 415 at a top 416a of the stack. Metal-filled slits 417 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 421 connects the drain-end 415 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

Figure 5:
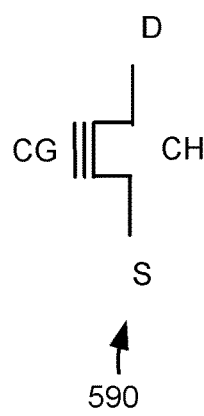
FIG. 5 depicts an example transistor.

FIG. 5 depicts an example transistor 590. The transistor comprises a control gate CG, a drain D, a source S and a channel CH. The control gate may also be referred to as a control terminal or as a gate terminal. The control gate is formed by a portion of one of the conductive layers (e.g., SGD, DWL, WLL, SGS), in one embodiment. The drain and source may also be referred to as terminals of the transistor. Note that which physical terminals of the transistor functions as the source and drain may depend on the voltages that are applied to the transistor. The transistor may be part of a select gate or a memory cell. In the case that the transistor is part of a select gate, the drain may be biased to a significantly higher voltage than the control gate during a portion of an erase procedure, which may result in a GIDL current. For example, the drain may be biased to a first voltage, while the control gate is biased to a second voltage. The GIDL current may help to pass the drain voltage to the channel of the NAND string, such that the channel of the memory cells may be at a voltage that is high enough to erase the memory cells.

In the case of a memory cell transistor, the control gate voltage can be set to a low value during erase such as 0 V so that the channel-to-control gate voltage results in a significant electrical field. In one embodiment, carrier recombination of holes from the channel with electrons in the charge trapping region of memory cells results in a lowering of the Vth of the memory cell. In the case of a select gate transistor, the control gate voltage can be set to a higher value such as 10 V so that the channel-to-control gate voltage is not high enough to lower the Vth of the transistor.

In one embodiment, a select gate transistor has a region having the same material as the memory film of a memory cell. This material serves as a gate dielectric in the select gate transistor. In this case, the threshold voltage of the select gate transistor can be altered similar to how a memory cell transistor's threshold voltage can be altered. In one embodiment a select gate transistor does not have the memory film material, but has a single dielectric (e.g., silicon dioxide) as a gate dielectric. In such as case, the select gate transistor's threshold voltage cannot be altered, in a significant way, by a voltage applied to the gate.

Figure 6A:
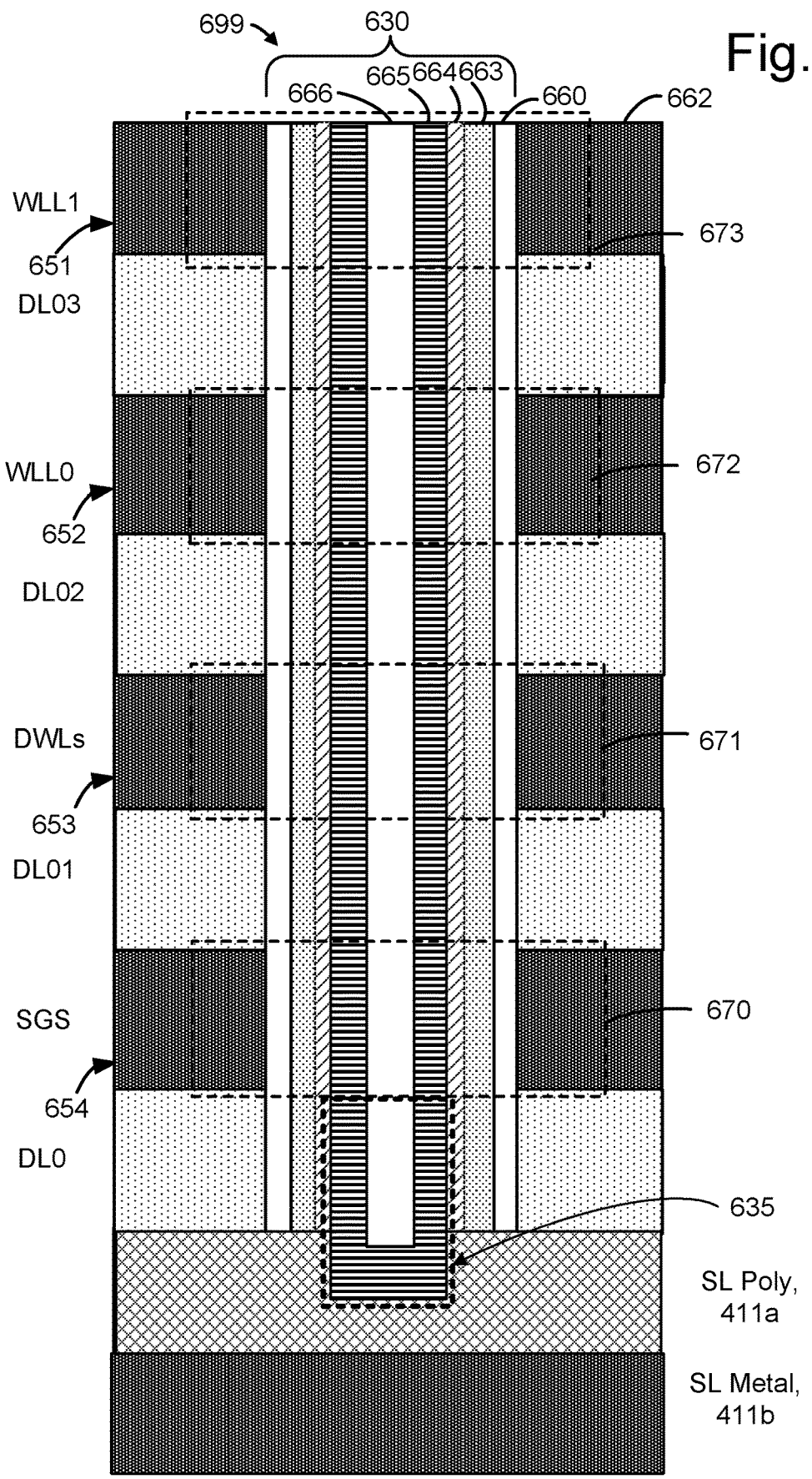
FIG. 6A depicts a close-up view of the region 422 of the stack of FIG. 4.

FIG. 6A depicts a close-up view of the region 422 of the stack of FIG. 4. Memory cells are formed at the different levels of the stack at the intersection of a word line layer and a memory hole. In this example, SGS transistor 670 is provided below dummy memory cell 671. The SGS transistor 670 may comprise one or more gate layers, in one embodiment. The SGS transistor gate layers may be electrically connected to the same voltage source, in one embodiment. Data memory cells 672, 673 are above the dummy memory cell 671. A number of layers can be deposited along the sidewall (SW) of the memory hole 630 and/or within each word line layer, e.g., using atomic layer deposition. For example, each pillar 699 or column which is formed by the materials within a memory hole can include a blocking oxide/block high-k material 660, charge-trapping layer 663 or film such as silicon nitride ($Si_3N_4$) or other nitride, a tunneling layer 664, a channel 665, and a dielectric core 666. The channel 665 is formed from a semiconductor, such as, silicon, silicon germanium, etc. In one embodiment, the channel 665 is formed from a polycrystalline semiconductor. In one embodiment, the channel 665 is formed from a crystalline semiconductor. A word line layer can include a conductive metal 662 such as Tungsten. A portion a word line layer that is adjacent to layer 660 is referred to as a control gate. For example, control gates 651, 652, 653 and 654 are provided. In this example, all of the layers except the metal are provided in the memory hole. In other approaches, some of the layers can be in the control gate layer. Additional pillars are similarly formed in the different memory holes. A pillar can form a columnar active area of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. In one embodiment, during erase, holes tunnel from the channel to the charge trapping layer to recombine with electrons thereby decreasing the Vth of memory cells.

Each of the memory holes can be filled with a plurality of annular layers comprising a blocking oxide layer, a charge trapping layer, a tunneling layer and a channel layer. A core region of each of the memory holes is filled with a dielectric material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

The source line 411 includes a polysilicon layer 411a and a metal layer 411b. The polysilicon layer 411a is in direct contact with the channel 665. Thus, the channel 665 is in electrical contact with the polysilicon layer 411a. The channel 665 is not in direct electrical contact with a p-well, in this example. Thus, the configuration in FIG. 6A does not allow the memory cells to be erased by raising a p-well voltage to a voltage to charge up the channel 665. However, note that even if the channel 665 is in direct electrical contact with a p-well, a two-sided GIDL erase may still be performed. Thus, embodiments of GIDL erase disclosed herein are not limited to the configuration of FIG. 6A.

A portion of the channel 665 that is indicated by region 635 is doped with an n-type donor, in one embodiment. For example, the portion of the channel 665 that is indicated by region 635 may be doped with phosphorus or arsenic. The doping is N+, in one embodiment. The rest of the channel 665 is not intentionally doped, in one embodiment. However, the undoped portion of the channel 665 may behave as p−. Thus, there is an N+/p− junction in the channel 665 at the interface between region 635 and the undoped portion of the channel 665, in one embodiment.

Figure 6B:
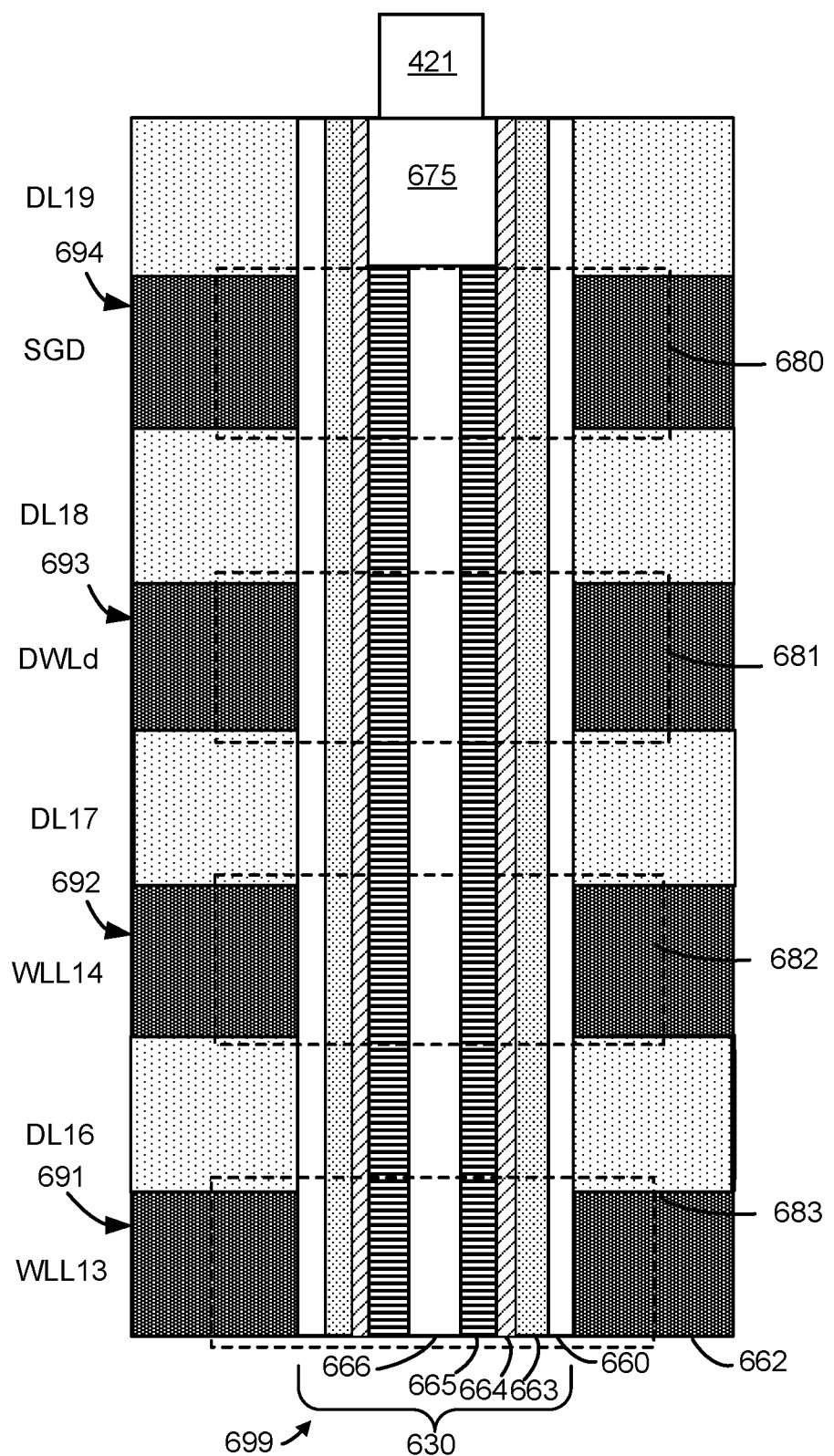
FIG. 6B depicts a close-up view of the region 423 of the stack of FIG. 4.

FIG. 6B depicts a close-up view of the region 423 of the stack of FIG. 4. Memory cells are formed at the different levels of the stack at the intersection of a word line layer and a memory hole. In this example, SGD transistor 680 is provided above dummy memory cell 681 and data memory cells 682 and 683. The SGD transistor 680 may comprise one or more gate layers, in one embodiment. The SGD transistor gate layers may be electrically connected to the same voltage source, in one embodiment. Pillar 699 or column which is formed by the materials within a memory hole can include a blocking oxide/block high-k material 660, charge-trapping layer 663 or film such as silicon nitride ($Si_3N_4$) or other nitride, a tunneling layer 664, a channel 665, and a dielectric core 666. Control gates 691, 692, 693 and 694 are provided. In this example, all of the layers except the control gates are provided in the memory hole. In other approaches, some of the layers can be in the control gate layer. Additional pillars are similarly formed in the different memory holes.

A polysilicon plug 675 forms an electrical contact between channel 665 and conductive via 421. The polysilicon plug 675 is doped with an n-type donor, in one embodiment. For example, the polysilicon plug 675 may be doped with phosphorus and/or arsenic. The doping is N+, in one embodiment. The channel 665 is not intentionally doped, in one embodiment. However, the channel 665 may behave as p−. Thus, there is an N+/p− junction at the interface between the polysilicon plug 675 and the channel 665, in one embodiment.

As discussed above, there may also be an N+/p− junction near the transistor 670. These two N+/p− junctions may have different doping concentrations. For example, the N+ concentration in region 635 may be different than the N+ concentration in the polysilicon plug 675. This may result in a different magnitude of GIDL current at transistors 670 and 680 even if those transistors have the same drain-to-gate voltages (or GIDL erase voltages). In one embodiment, different magnitude drain-to-gate voltages (or GIDL erase voltages) are deliberately created at terminals of transistors 670 and 680 in order to compensate for physical differences (such as doping concentrations) at each end of the NAND string in order to achieve substantially the same magnitude GIDL current at each end of the NAND string (e.g., at transistors 670 and 680). This may improve erase speed, reduce current consumption, and/or reduce power consumption.

Figure 7:
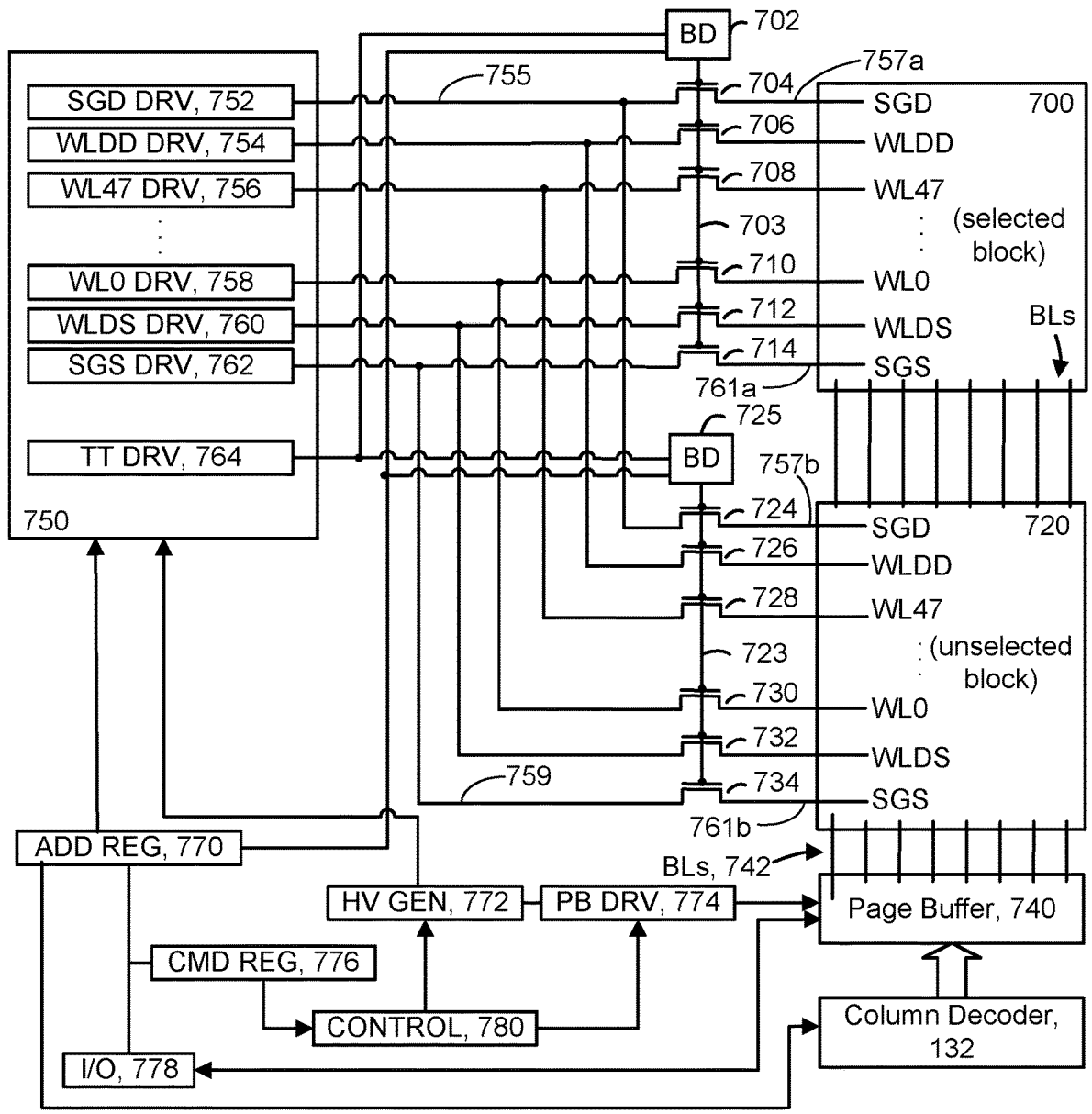
FIG. 7 is a diagram that shows details of one embodiment of circuits for applying voltages to a memory structure.

FIG. 7 is a diagram that shows details of one embodiment of circuits for applying voltages to a memory structure 126. Two blocks 700, 720 of memory cells are depicted. Circuits of FIG. 7 apply voltages to word lines and select lines. State machine 112 provides control signals to the circuits, in one embodiment. For example, state machine 112 may issue control signals to one or more of CONTROL 780, High Voltage Generator (HV GEN) 772, Page Buffer Driver (PB DRV) 774, Command Register (CMD REG) 776 and Input/Output (I/O) Buffer 778. In an embodiment, state machine 112 issues control signals to CONTROL 780, which in turn controls other elements such as HV GEN 772 and PB DRV 774.

In an embodiment, HV GEN 772 is connected to word line driver 750, to control magnitudes and timing of voltages. In one embodiment, HV GEN 772 provides a temperature dependent erase voltage to the word line driver 750. The temperature dependent erase voltage may be applied by SGG DRV 752 to the select line SGD in one of the blocks 700, 720. The temperature dependent erase voltage may be applied by SGS DRV 762 to the select line SGS in one of the blocks 700, 720.

In one embodiment, HV GEN 772 is connected PB DRV 774, which is connected to page buffer 740 to control the page buffer 740. The page buffer 740 may include sense blocks, such as SB1 of FIG. 1. In one embodiment, HV GEN 772 provides a temperature dependent erase voltage to the page buffer 740. The temperature dependent erase voltage may be applied to the bit lines 742. In one embodiment, HV GEN 772 provides a temperature dependent erase voltage to the source line 411 (see source line in FIG. 4; the connections to source line 411 are not depicted in FIG. 7).

In one embodiment, the combination of the voltages applied to a bit line and to the SGD line are referred to as a GIDL erase voltage. Thus, the HV GEN 772 may provide a temperature dependent GIDL erase voltage to the drain sides of NAND strings. It is not necessary for both the voltage to the bit line and to the SGD line to be temperature dependent. In one embodiment, the erase voltage applied to the bit lines is temperature dependent, but the voltage applied to the SGD line is temperature independent. In one embodiment, the erase voltage applied to the bit lines is temperature independent, but the voltage applied to the SGD line is temperature dependent.

In one embodiment, the combination of the voltages applied to the source line and to the SGS line are referred to as a GIDL erase voltage. Thus, the HV GEN 772 may provide a temperature dependent GIDL erase voltage to the source sides of NAND strings. It is not necessary for both the voltage to the source line and to the SGS line to be temperature dependent. In one embodiment, the erase voltage applied to the source line is temperature dependent, but the voltage applied to the SGS line is temperature independent. In one embodiment, the erase voltage applied to the source line is temperature independent, but the voltage applied to the SGS line is temperature dependent.

There may be a leakage current along the pathway between the HV GEN 772 and the bit lines 742, the SGD line, the SGS line, and/or the source line. A GIDL erase may depend on having adequate GIDL current in the NAND strings. The leakage current may impact the ability to have an adequate current in the NAND strings. In some embodiment, the HV GEN 772 is controlled in a manner to adjust the erase voltage (to bit lines 742, SGS, SGS, and/or source line) in order to mitigate or compensate for the leakage current. Therefore, an adequate GIDL current flows in the NAND strings such that the GIDL erase operation is efficient. Moreover, the leakage current may be temperature dependent. In some embodiments, the HV GEN 772 is controlled in a manner to mitigate or compensate for the temperature dependent leakage current during a GIDL erase of NAND strings.

Each block comprising storage elements is associated with a set of transfer transistors, in one possible embodiment. For example, block 700, which is a selected block in this example, e.g., a block in which a programming, erase, or sense operation is to take place, includes a drain-side select gate (SGD) connected to a transfer transistor 704, a drain-side dummy word line (WLDD) connected to a transfer transistor 706, a word line (WL47) connected to a transfer transistor 708, intermediate word lines WL30-WL1 (not shown) connected to respective transfer transistors (not shown), a word line (WL0) connected to a transfer transistor 710, a source-side dummy word line (WLDS) connected to a transfer transistor 712, and a source-side select gate (SGS) connected to a transfer transistor 714.

The control gate of each transfer transistor of block 700 is connected to a block decoder (BD) 702 via a common path 703. The BD 702 receives a voltage from a transfer transistor driver (TT DRV) 764 and a control signal from an address register (ADD REG) 770. The control signal includes an address. If the address matches an address of the BD 702, BD 702 acts as a conductive switch which passes the voltage to the control gates of the associated transfer transistors via path 703. If the address does not match the address of BD 702, BD 702 acts as a non-conductive switch which does not pass the voltage to the control gates of the associated transfer transistors.

Each transfer transistor may be an n-channel MOSFET, for example, which has a drain node on the left hand side and a source node on the right hand side. The drain node for each transfer transistor is connected to a respective voltage driver in a set of high-voltage voltage drivers 750. Each driver may include an on-chip charge pump.

For example, the transfer transistor 704 is connected to a drain select gate driver (SGD DRV) 752, the transfer transistor 706 is connected to a dummy word line driver (WLDD DRV) 754, the transfer transistor 708 is connected to the word line driver (WL47 DRV) 756, . . . , the transfer transistor 710 is connected to the word line driver (WL0 DRV) 758, the transfer transistor 712 is connected to the source side dummy word line driver (WLDS DRV) 760, and the transfer transistor 714 is connected to the source select gate driver (SGS DRV). Each voltage driver can be independently controlled to provide a desired output voltage.

A similar arrangement is used for the example unselected block 720, which includes a transfer transistor 724 connected to SGD and SGD DRV 752, a transfer transistor 726 connected to WLDD and WLDD DRV 754, a transfer transistor 728 connected to WL47 and WL47 DRV 756, . . . , a transfer transistor 730 connected to WL0 and WL0 DRV 758, a transfer transistor 732 connected to WLDS and WLDS DRV 760, and a transfer transistor 734 connected to SGS and SGS DRV 762.

The SGD lines for a plane may be referred to herein as local SGD lines and a global SGD line. For example, the SGD line in block 700 may be referred to as a local SGD line 757a. The SGD line in block 720 may also be referred to as a local SGD line 757b. The line 755 connected to SGD DRV 752 may be referred to herein as a global SGD line (e.g., SGGg). Each local SGD line 757 may be connected to the global SGD line 755 by a transfer transistor (e.g., 704, 724).

The SGS lines for a plane may be referred to herein as local SGS lines and a global SGS line. For example, the SGS line in block 700 may be referred to as a local SGS line 761a. The SGD line in block 720 may also be referred to as a local SGD line 761b. The line 759 connected to SGS DRV 762 may be referred to herein as a global SGS line (e.g., SGSg). Each local SGS line 761 may be connected to the global SGS line 759 by a transfer transistor (e.g., 714, 734).

The control gates of the transfer transistors of unselected block 720 are connected to a respective block decoder (BD) 725 via a common path 723. BD 725 also is connected to TT DRV 764 to receive a voltage, and to address register 770 to receive a control signal which instructs BD 725 to pass or not pass the voltage to the control gates of the associated transfer transistors via path 723. Address register (ADD REG) 770 also communicates with the voltage drivers in the set of high-voltage voltage drivers 750.

A number of bit lines (BLs) 742 extend across the selected block 700 and the unselected block 720 (and across additional unselected blocks, not shown, in some implementations) and into a page buffer 740, which is responsive to column decoder 132. Page buffer 740 stores data which are written into, or read from, a selected word line of the selected block.

During an operation of the memory device, address register 770 provides a data load command to an input-output buffer 778 and to a command register 776. Input-output buffer 778 provides the command to page buffer 740. Command register 776 provides a command to a control circuit 780, which instructs a high voltage generator 772 to control voltage drivers 750 at appropriate levels.

Typically, during programming, the driver of the selected word line provides a programming level voltage, such as 12-26 V and the unselected word lines receive a pass voltage $V_{PASS}$ such as 4-6 V. During sensing, the driver of the selected word line provides a read or verify level voltage ($V_{CGR}$ or $V_{VERIFY}$, respectively), while the unselected word lines receive a read pass voltage, $V_{READ\text{-}PASS}$. Control 780 also instructs the page buffer driver (PB DRV) 774 to control page buffer 740. Address register 770 also communicates with column decoder 132.

Figure 8:
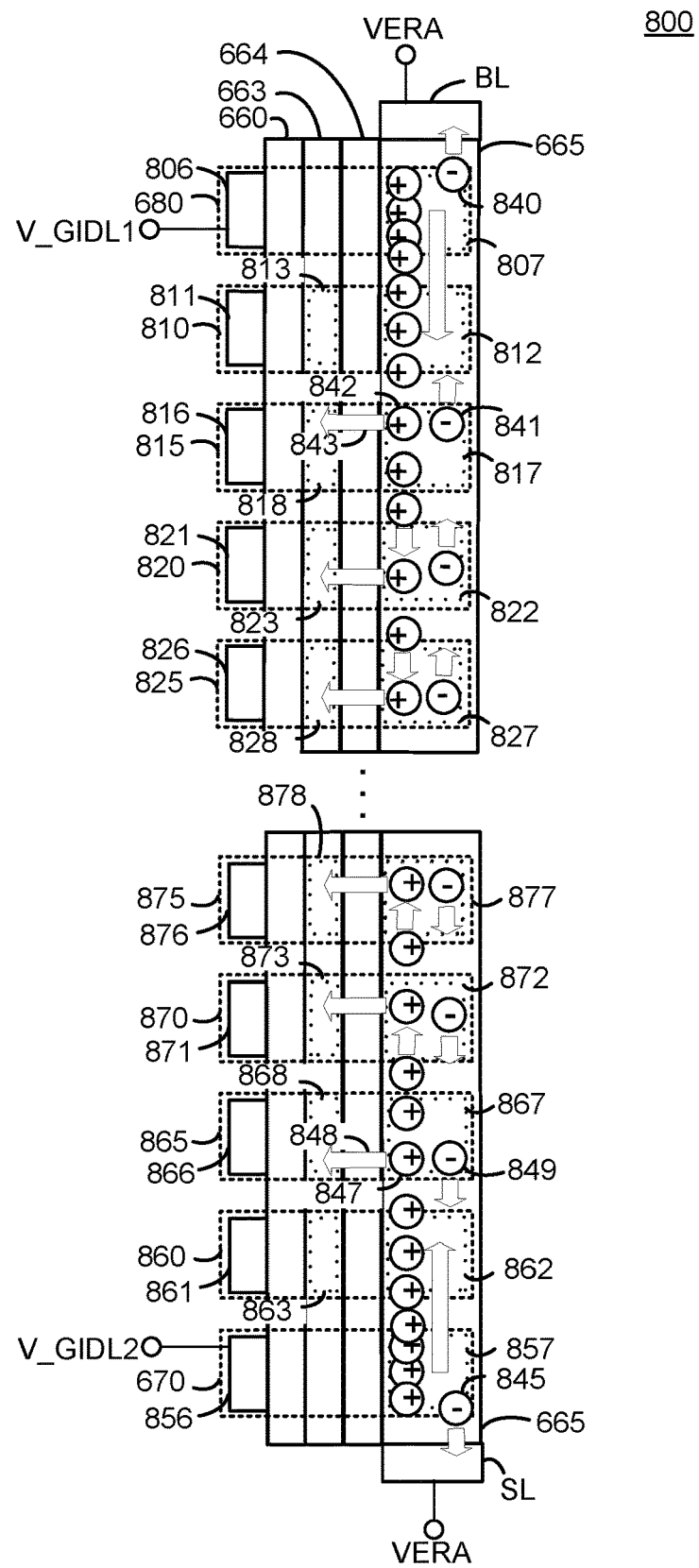
FIG. 8 depicts the movement of holes and electrons in a NAND string during a two-sided GIDL erase.

FIG. 8 depicts the movement of holes and electrons in a NAND string during a two-sided GIDL erase. An example NAND string 800 that includes a channel layer 665 connected to a bit line (BL) and to a source line (SL). A tunnel layer (TNL) 664, charge trapping layer (CTL) 663, and a block oxide (BOX) 660 are layers which extend around the memory hole of the string. Different regions of the channel layers represent channel regions which are associated with respective storage elements or select gate transistors. These channel regions are at a same height and stack level in the stacked memory device as the control gates of the storage elements or select gate transistors.

The NAND string 800 includes an SGD transistor 680 with a control gate 806 and a channel region 807. An erase voltage V_GIDL1 is applied to the control gate 806 of the SGD transistor 680. The NAND string 800 also includes storage elements 810, 815, 820, and 825, control gates 811, 816, 821, and 826, CTL regions 813, 818, 823, and 828, and channel regions 812, 817, 822, and 827, respectively.

The NAND string 800 includes an SGS transistor 670 with a control gate 856 and a channel region 857. An erase voltage V_GIDL2 is applied to the control gate 856 of the SGS transistor 670. The NAND string 800 also includes storage elements 860, 865, 870, and 875, control gates 861, 866, 871, and 876, CTL regions 863, 868, 873, and 878, and channel regions 862, 867, 872, and 877, respectively.

An erase voltage VERA is applied to both the bit line (BL) and to the source line (SL). The difference between VERA and V_GIDL1 may be referred to as ΔGIDL1. The difference between VERA and V_GIDL2 may be referred to as ΔGIDL2. Note that ΔGIDL1 and ΔGIDL2 are examples of GIDL erase voltages. Herein, the term "erase voltage" may be applied to VERA, V_GIDL1, and/or V_GIDL2. An example magnitude for VERA is 24V, and an example magnitude for V_GIDL1 and V_GIDL2 is 12V. However, it is not required that V_GIDL1 have the same magnitude as V_GIDL2. In some embodiments, ΔGIDL1 and ΔGIDL2 are temperature dependent. Temperature dependence for ΔGIDL1 may be achieved by VERA and/or V_GIDL1 being temperature dependent. Temperature dependence for ΔGIDL2 may be achieved by VERA and/or V_GIDL2 being temperature dependent.

Representative holes are depicted in the channel layers as circles with a "+" sign and representative electrons are depicted in the channel layers as circles with a "−" sign. Electron-hole pairs are generated by a GIDL process. Initially, during an erase operation, the electron-hole pairs are generated at the SGD and SGS transistors. The holes move away from the driven ends into the channel, thereby charging the channel to a positive potential. The electrons generated at the SGD transistor 680 move toward the bit line (BL) due to the positive potential there. The electrons generated at the SGS transistor 670 move toward the source line (SL) due to the positive potential there. Subsequently, during the erase period of each storage element, additional holes are generated by GIDL at virtual junctions which are formed in the channel at the edges of the control gate of the storage element. However, some holes are also removed from the channel as they tunnel to the CTL regions.

Electrons are also generated by the GIDL process. Initially, during the erase operation, the electrons are generated at the SGD and SGS transistors and move toward the driven ends. Subsequently, during the erase period of each storage element, additional electrons are generated by GIDL at virtual junctions, which are formed in the channel at the edges of the control gate of the storage element.

At one end (e.g., drain side) of the NAND string, example electrons 840 and 841 move toward the bit line. Electron 840 is generated at the SGD transistor and electron 841 is generated at a junction of the storage element 815 in the channel region 817. Also, in the drain side, example holes including a hole 842 move away from the bit line as indicated by arrows. The hole 842 is generated at a junction of the storage element 815 in the channel region 817 and can tunnel into the CTL region 818 as indicated by arrow 843.

At the other end (e.g., source side) of the NAND string, example electrons 845 and 849 move toward the source line. Electron 845 is generated at the SGS transistor and electron 849 is generated at a junction of the storage element 865 in the channel region 867. Also, in the source side, example holes including a hole 847 move away from the source line as indicated by the arrow. The hole 847 is generated at a junction of the storage element 865 in the channel region 867 and can tunnel into the CTL region 868 as indicated by arrow 848.

Figure 9:
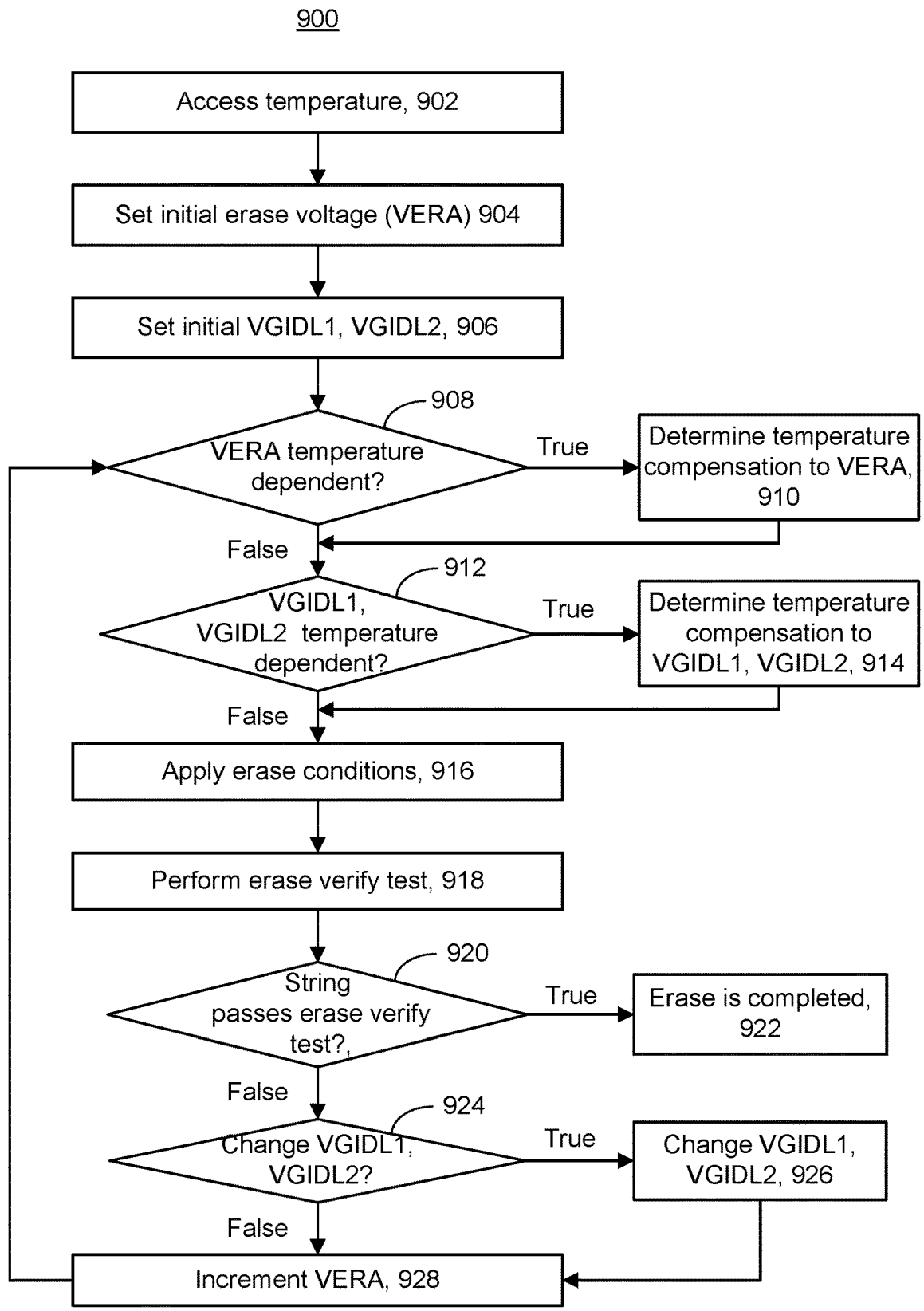
FIG. 9 depicts one embodiment of a process for performing a GIDL erase operation.

FIG. 9 depicts one embodiment of a process 900 for performing a GIDL erase operation. Process 900 is described with respect to a NAND string that comprises non-volatile memory cells. The NAND string includes a select transistor on each end of the NAND string. For example, a first select transistor may be a drain side select transistor, which has one of its terminals (e.g., drain) coupled to a bit line. A second select transistor may be a source side select transistor, which has one of its terminals coupled to a source line. The process 900 may be performed in parallel on many NAND strings. The process 900 may be used to erase a NAND string such as depicted in FIGS. 4, 6A and 6B. Process 900 describes a two-sided GIDL erase. The process 900 may be modified to apply the GIDL erase voltage at only the drain end of the NAND string, or only the source end of the NAND string. Thus, the process 900 may be modified to perform a single-sided GIDL erase.

Process 900 may be used to perform GIDL erase in which the magnitude of one or more erase voltages is temperature dependent. In one embodiment, the magnitude of the erase voltage (e.g., VERA) applied to the bit line is temperature dependent. In one embodiment, the magnitude of the erase voltage (e.g., VERA) applied to the source line is temperature dependent. In one embodiment, the magnitude of the erase voltage (e.g., V_GIDL1) applied to the SGD line is temperature dependent. In one embodiment, the magnitude of the erase voltage (e.g., V_GIDL2) applied to the SGS line is temperature dependent. As a consequence of one or more of the aforementioned erase voltages being temperature dependent, the GIDL erase voltage (e.g., drain to gate voltage of select transistor) will be temperature dependent.

Step 902 includes accessing a present temperature. The temperature sensor 134 on the memory die 108 may be used to access the present temperature. The present temperature may be referred to as a present operating temperature.

Step 904 includes setting a magnitude of an initial erase voltage (VERA). This is the erase voltage that will be applied to the bit line and to the source line. An example of the magnitude is 24V. The magnitude of the initial VERA may be stored as a parameter on the memory die 108. Thus, step 904 may include accessing this parameter from storage on the memory die 108.

Step 906 sets a magnitude of an initial VGIDL1 and a magnitude of an initial VGIDL2. VGIDL1 will be applied to the SGD line, and hence to the control gate of the drain side select transistor. VGIDL2 will be applied to the SGS line, and hence to the control gate of the source side select transistor. An example of the magnitude is 12V. VGIDL1 and VGIDL2 may have the same magnitude, or may have different magnitudes. One reason for having VGIDL1 and VGIDL2 at different magnitudes is that the drain side select transistor may have different physical characteristics than the source side select transistor, as has been discussed above. The magnitude of VGIDL1 and VGIDL2 may be stored as parameters on the memory die 108. Thus, step 906 may include accessing these parameters from storage on the memory die 108.

Step 908 is a determination of whether VERA is to be temperature dependent. This test may be based on accessing a parameter in storage on the memory die 108. In one embodiment, the memory controller 122 instructs the memory die 108 that VERA is to be temperature dependent. This instruction could be with a command to perform the GIDL erase, or at another time such as when the memory die 108 is powered on. If VERA is to be temperature dependent, control passes to step 910.

Step 910 includes determining a temperature compensation for VERA. An example temperature compensation is shown in Equation 1.

$$VERA = VERA_{DEFAULT}(1+f1*(85-\text{temp})) \quad \text{(Eq. 1)}$$

In Equation 1, $VERA_{DEFAULT}$ is the value from step 904. In Equation 1, f1 is a parameter, which may be accessed from storage on the memory die 108. In Equation 1, temp is the present temperature, which may be expressed in degrees Celsius. This is the temperature that was accessed in step 902. In some embodiments, the value for VERA for each of a number of temperatures is stored in a table. Thus, the value for VERA may be accessed from a table.

Figure 10A:
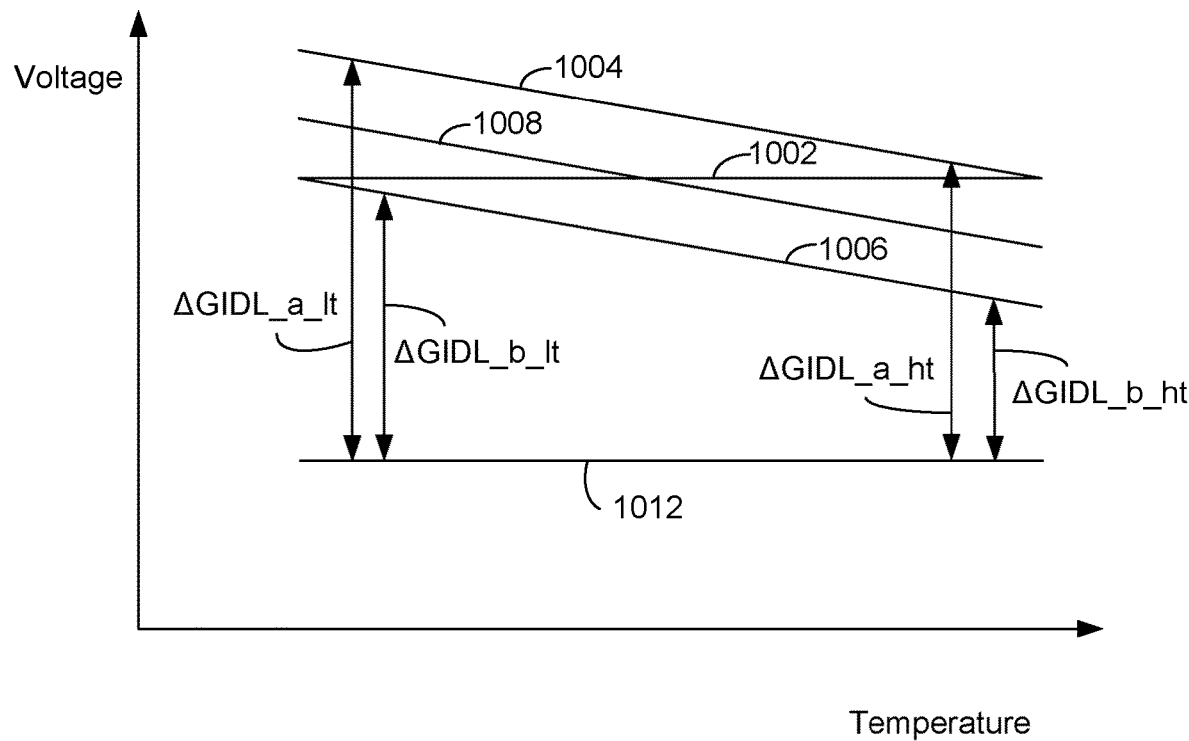
FIGS. 10A, 10B, 10C, and OD depict graphs of several different embodiments of erase voltages versus temperature.

Equation 1 describes just one example of the temperature compensation. FIG. 10A depicts a graph that depicts several different examples of VERA versus temperature. FIG. 10A thus depicts different types of temperature compensation. Plot 1002 represents a temperature independent VERA, which may be referred to as a default VERA. Plots 1004, 1006, and 1008 represent three different embodiments of a temperature dependent VERA. Note that the plots extend over a typical range in operating temperature. For plots 1004, 1006, and 1008 VERA decreases as temperature increases. Plot 1012 represents a default voltage applied to the select line (e.g., V_GIDL1, V_GIDL2). In this case, V_GIDL is temperature independent. Note that the parameter f1 in Equation 1 may be derived from a temperature compensation plot such as one of the plots in FIG. 10A. Note that Equation 1 may be modified to be adapted to any of the temperature compensations in FIG. 10A, as well as many other variations of temperature compensation. Also note that although some temperature compensation plots depicted in the drawings are lines, the temperature compensation is not limited to linear compensation. In one embodiment, the temperature compensation is non-linear.

Plot 1004 represents one embodiment of a temperature dependent VERA in which at a higher temperature, VERA may be equal to the default VERA. In general, plot 1004 is above plot 1002 such that VERA is higher than the default VERA. The temperature compensation of plot 1004 may be used if performance is a concern at lower temperatures. By having VERA above the default VERA at lower temperatures, more GIDL current may be generated, thereby improving erase performance. The gap between plot 1004 and 1012 is the effective GIDL erase voltage. At a low temperature this is labeled as ΔGIDL_a_lt. At a high temperature this is labeled as ΔGIDL_a_ht.

Plot 1006 represents one embodiment of a temperature dependent VERA in which at a lower temperature, VERA may be equal to the default VERA. In general, plot 1006 is below plot 1002 such that VERA is lower than the default VERA which may save current and/or power. The temperature compensation of plot 1006 may be used if performance is acceptable at lower temperatures, thereby allowing current and/or power to be saved at higher temperatures. The gap between plot 1006 and 1012 is the effective GIDL erase voltage. At a low temperature this is labeled as ΔGIDL_b_lt. At a high temperature this is labeled as ΔGIDL_b_ht.

Plot 1008 represents one embodiment of a temperature dependent VERA that in which at a mid-point of an operating temperature range, VERA may be equal to the default VERA. Plot 1008 is above plot 1002 at lower temperatures such that VERA is higher than the default VERA. Plot 1008 is below plot 1002 at higher temperatures such that VERA is lower than the default VERA.

Returning again to the discussion of FIG. 9, after step 910, control passes to step 912 (control also passes to step 912 if step 910 is not performed). Step 912 is a determination of whether VGIDL1 and VGIDL2 are to be temperature dependent. This test may be based on accessing a parameter in storage on the memory die 108. In one embodiment, the memory controller 122 instructs the memory die 108 that VGIDL1 and VGIDL2 are to be temperature dependent. This instruction could be with a command to perform the erase, or at another time such as when the memory die 108 is powered on. If VGIDL1 and VGIDL2 are to be temperature dependent, control passes to step 914.

Figure 10B:
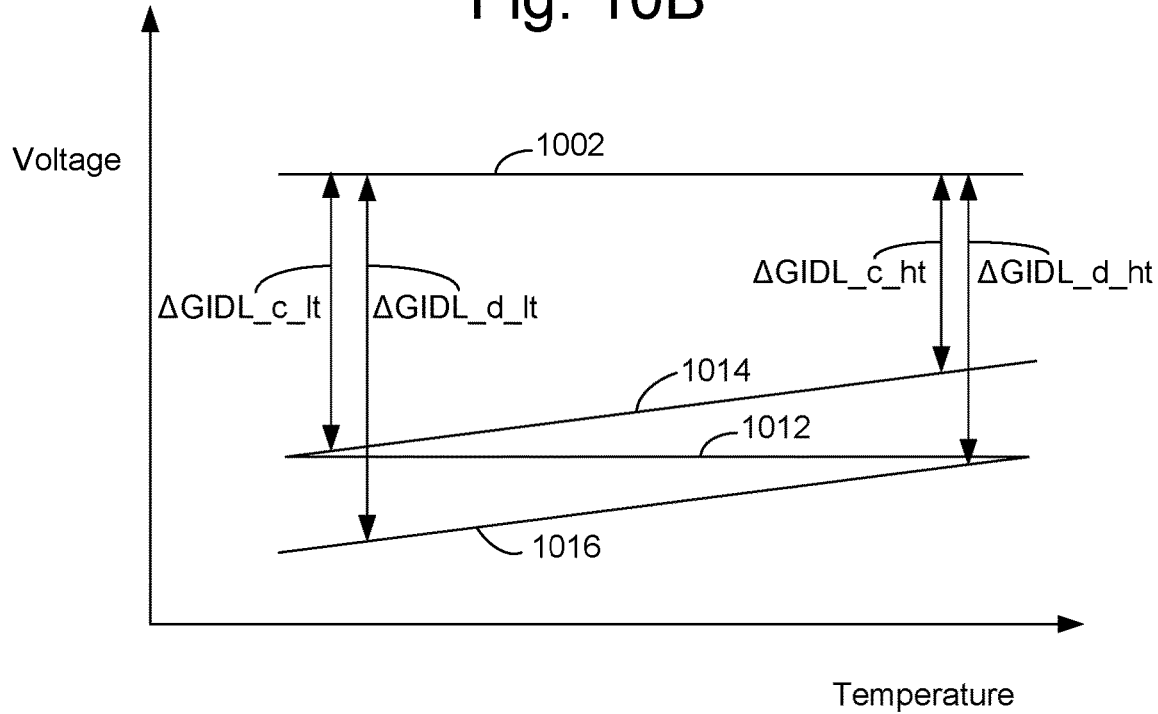
Figure 14:
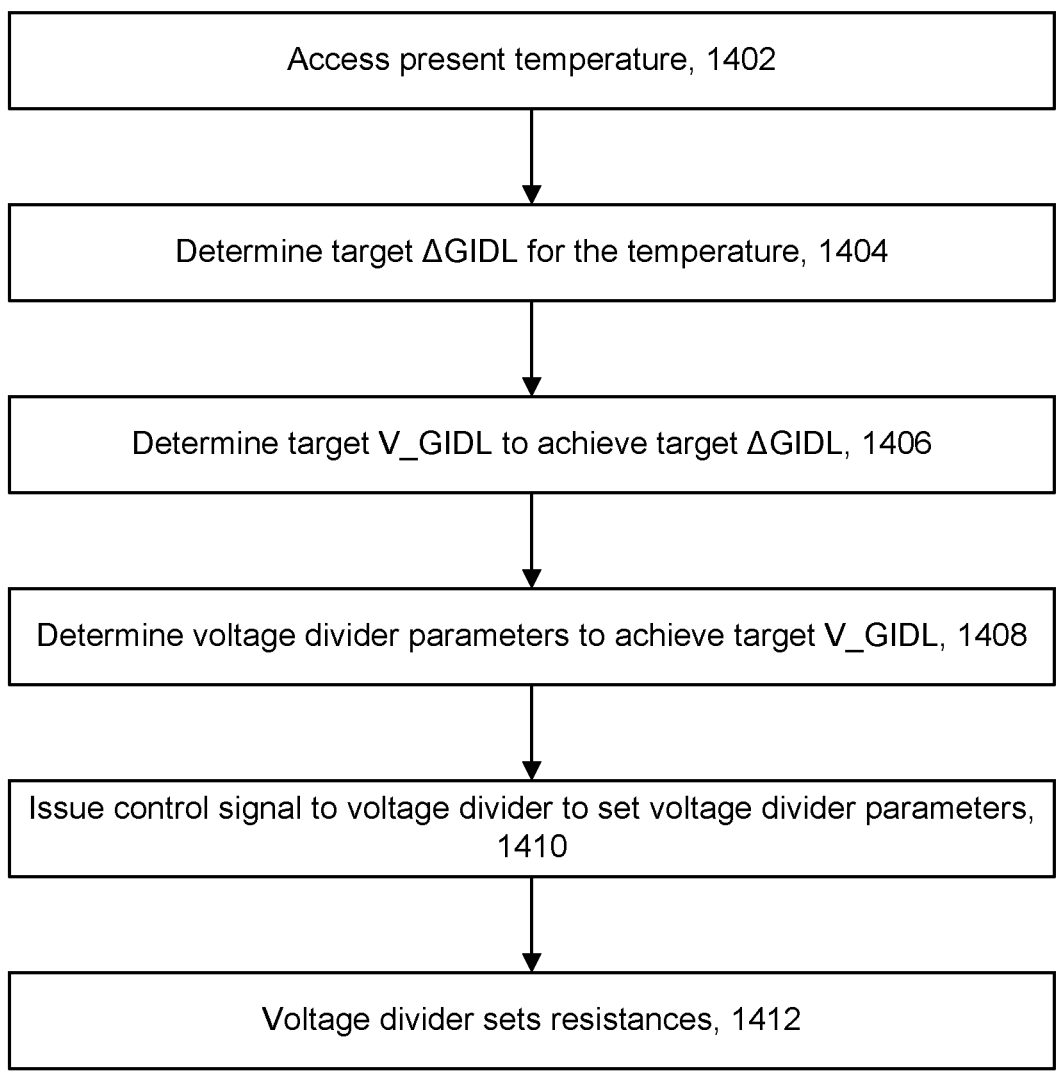
FIG. 14 depicts a flowchart of one embodiment of a process of providing a temperature dependent erase voltage.

Step 914 includes determining a temperature compensation for VGIDL1 and VGIDL2. In some embodiments, the determination may be based on an Equation similar to Equation 1. FIG. 14 provides further details for one embodiment of determining a temperature compensation for VGIDL1 and VGIDL2. In one embodiment, the values for VGIDL1 and VGIDL2 are accessed from a table. FIG. 10B depicts a graph that depicts several different examples of VGIDL versus temperature. For simplicity, VGIDL in FIG. 10B could represent either VGIDL1 or VGIDL2. As noted above, VGIDL1 and VGIDL2 may or may not have the same magnitude. FIG. 10B thus depicts different types of temperature compensation. Plot 1002 represents the temperature independent or default VERA, which was depicted in FIG. 10A. Plot 1012 represents the temperature independent or default VGIDL. Plots 1014 and 1016 represent two different embodiments of a temperature dependent VGIDL. For both plot 1014 and 1016, VGIDL increases as temperature increases. Since the difference between VERA and VGIDL determines the drain to gate voltage of the select transistor, an increase in VGIDL is similar to a decrease in VERA.

Plot 1014 represent one embodiment of a temperature dependent VGIDL in which at a lower temperature, VGIDL may be equal to the default VGIDL. In general, plot 1014 is above plot 1012 such that VGIDL is higher than the default VGIDL. The gap between plot 1002 and 1014 is the effective GIDL erase voltage. At a low temperature this is labeled as ΔGIDL_c_lt. At a high temperature this is labeled as ΔGIDL_c_ht.

Plot 1016 represent one embodiment of a temperature dependent VGIDL in which at a higher temperature, VGIDL may be equal to the default VGIDL. In general, plot 1016 is below plot 1012 such that VGIDL is lower than the default VGIDL. The gap between plot 1002 and 1016 is the effective GIDL erase voltage. At a low temperature this is labeled as ΔGIDL_d_lt. At a high temperature this is labeled as ΔGIDL_d_ht.

The examples in FIGS. 10A and 10B depict linear temperature compensation. However, the temperature compensation could be non-linear. In some embodiments, temperature compensation is applied to both VERA and VGIDL.

Figure 10C:
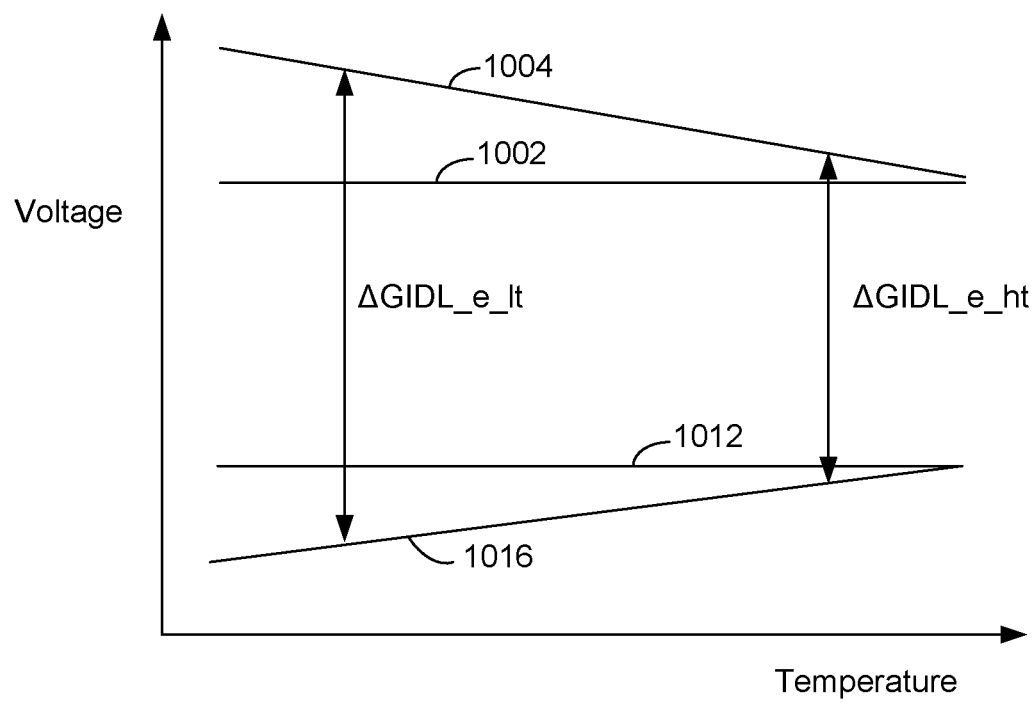

FIG. 10C depicts a graph of temperature compensation is applied to both VERA and VGIDL. Plot 1002 is the temperature independent VERA, depicted for reference. Plot 1012 is the temperature independent V_GIDL, depicted for reference. Plot 1004 is a temperature dependent VERA. Plot 1016 is a temperature dependent V_GIDL. The gap between plot 1004 and 1016 is the effective GIDL erase voltage. At a low temperature this is labeled as ΔGIDL_e_lt. At a high temperature this is labeled as ΔGIDL_e_ht.

Figure 10D:
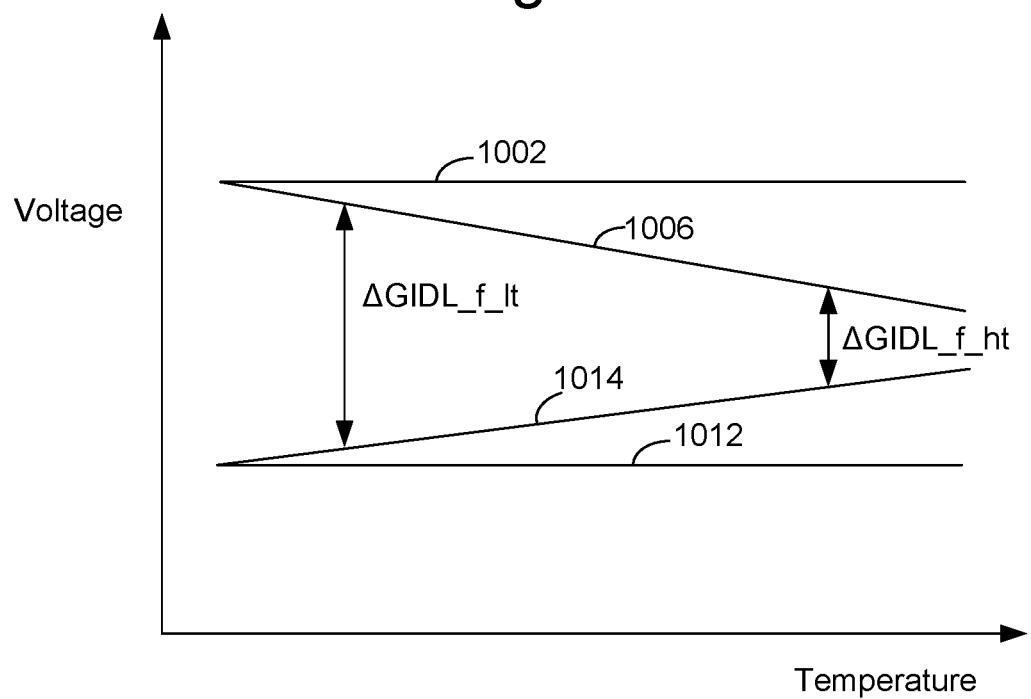

FIG. 10D depicts a graph of temperature compensation is applied to both VERA and VGIDL. Plot 1002 is the temperature independent VERA, depicted for reference. Plot 1012 is the temperature independent V_GIDL, depicted for reference. Plot 1006 is a temperature dependent VERA. Plot 1014 is a temperature dependent V_GIDL. The gap between plot 1006 and 1014 is the effective GIDL erase voltage. At a low temperature this is labeled as ΔGIDL_f_lt. At a high temperature this is labeled as ΔGIDL_f_ht.

Returning again to the discussion of FIG. 9, after step 914, control passes to step 916 (control also passes to step 916 if step 914 is not performed). Step 916 includes applying erase conditions. Step 916 may include applying VERA to a bit line and a source line. Step 916 may include applying VGIDL1 to the SGD line. Step 916 may include applying VGIDL2 to the SGS line. In one embodiment, the SGD line and the SGS line are left floating. Erase enable voltages may be applied to the word lines. In one embodiment, the word lines are grounded.

Step 918 includes performing an erase verify test for the NAND string. Typically, this involves setting an erase verify voltage to the word lines that are connected to control gates of memory cells on the NAND string while sensing a current in the NAND string. If the current is sufficiently high, the NAND string is considered to pass the verify test. If the NAND string passes the erase verify test at decision step 920, the erase operation is completed, at step 922. If the NAND string does not pass the erase verify test at decision step 920, the process 900 continues at step 924.

Step 924 includes a determination of whether the default VGIDL1 and VGIDL2 are to be changed. If so, then the default VGIDL1 and VGIDL2 are changed in step 926. In one embodiment, for the purpose of this calculation, the default values of VGIDL1 and VGIDL2 are ones for which temperature compensation was not performed in step 914. Note that the process 900 may use the updated default values to later calculate a temperature compensated value for VGIDL1 and VGIDL2.

In one embodiment, whether or not the default VGIDL1 and VGIDL2 are changed in step 926, the default VERA is incremented in step 928. In one embodiment, the value of the default VERA that is used for this calculation is one for which temperature compensation was not performed in step 910. In other words, step 928 updates the default VERA. Here, the default value of VERA refers to the value for which temperature compensation is not calculated. Note that the process 900 may use the updated default value to later calculate a temperature compensated value for VERA.

Then, the next iteration of the erase procedure is performed by returning to step 908. Note that the temperature compensation may be applied to the default VERA and/or default VGIDL/VGIDL2 in steps 910 and 914, respectively. An erase iteration (or loop) typically involves applying erase conditions followed by performing a verify test, although in some cases the verify test is omitted.

Figure 11:
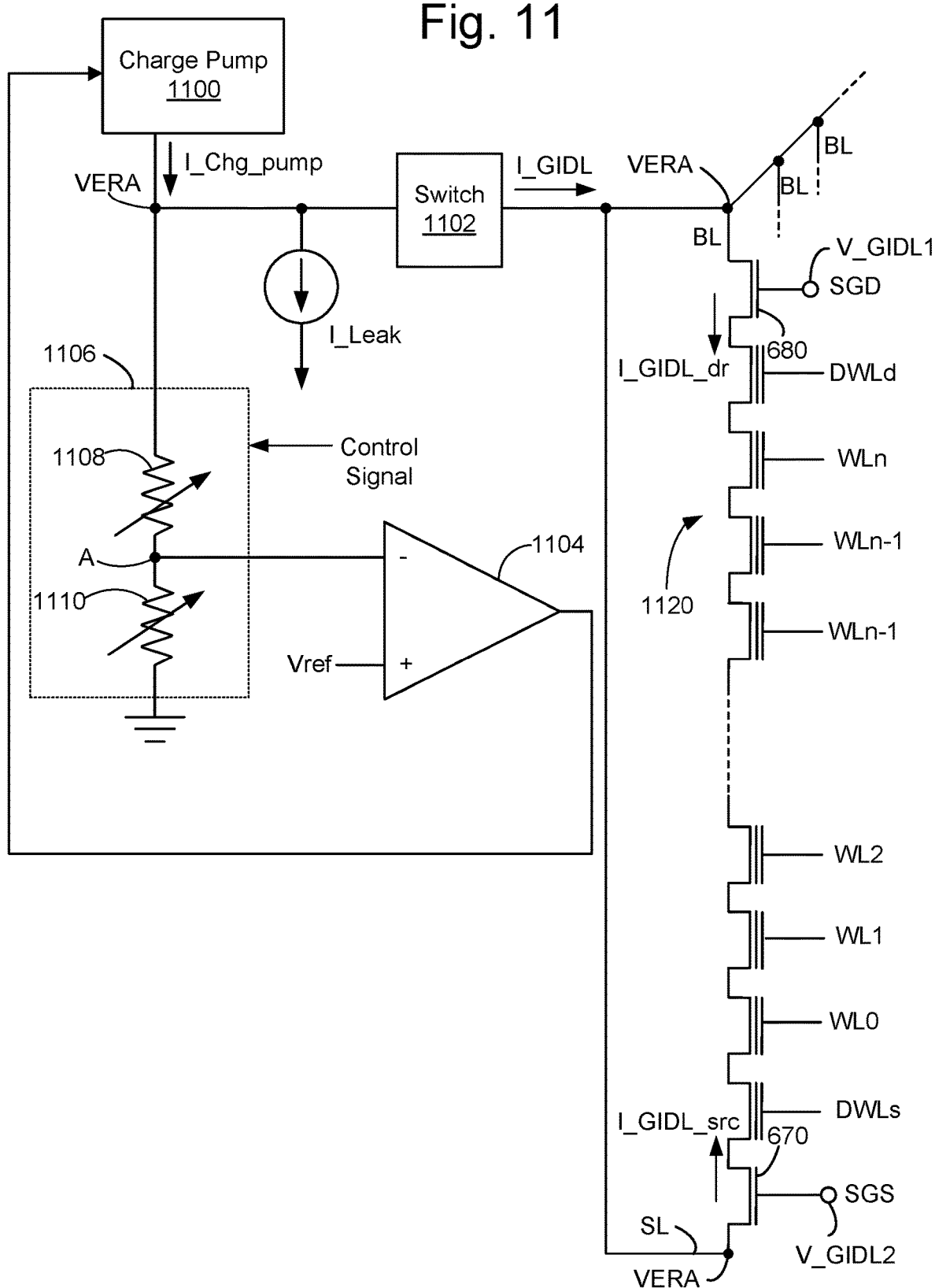
FIG. 11 is a diagram of one embodiment of a system configured to apply a temperature dependent erase voltage to NAND strings.

FIG. 11 is a diagram of one embodiment of a system configured to apply a temperature dependent erase voltage to NAND strings. The components in FIG. 11 may reside within memory system 100. In one embodiment, the components in FIG. 11 reside on memory die 108. In one embodiment, the NAND strings reside in a 3D memory array. The system includes a charge pump 1100, a switch 1102, a voltage regulator 1104, and a voltage divider 1106. In one embodiment, the charge pump 1100, voltage regulator 1104 and voltage divider 1106 reside in the HV GEN 772 (see FIG. 7).

The charge pump 1100 is configured to output an erase voltage (VERA). The charge pump 1100 is connected to a switch 1102 in order to deliver VERA to the bit lines (BL) and to the source line (SL). The diagram is simplified and does not show elements such as sense amplifiers. A sense amplifier may be connected to each bit line to provide VERA to the bit line. There may be other switches in addition to switch 1102 to route the erase voltage (VERA). The charge pump 1100 provides a current I_Chg_pump. In one embodiment, I_Chg_pump is equal to I_GIDL plus I_Leak. I_GIDL is the total GIDL erase current provided to all NAND strings undergoing GIDL erase. Stated another way, I_GIDL is the total GIDL erase current drawn by all NAND strings undergoing GIDL erase. The current I_Leak represents a leakage current along the path of delivering VERA from the charge pump 1100 to the NAND strings undergoing GIDL erase.

The voltage regulator 1104 is configured to regulate the voltage VERA that is output by the charge pump 1100. The inverting input of the voltage regulator 1104 is connected to Node A in voltage divider network 1106 in order to receive a voltage that is based on VERA. The voltage at Node A may be referred to as a feedback voltage. The voltage at Node A will be some proportion of VERA, as will be explained below. The voltage divider network 1106 is configured to change the proportion in response to a control signal, which allows the voltage at Node A to be temperature dependent. The non-inverting input of the regulator 1104 is provided with a reference voltage Vref. The output of the voltage regulator 1104 may be based on a comparison of the voltage a Node A with the reference voltage. The regulator 1104 outputs a control signal to the charge pump 1100. In this manner VERA may be regulated. Moreover, because the voltage at Node A may be controlled to be temperature dependent, VERA may therefore be controlled to be temperature dependent.

In one embodiment, voltage divider network 1106 has upper variable resistor 1108 and lower variable resistor 1110. Node A is labeled between the upper variable resistor 1108 and the lower variable resistor 1110. Upper variable resistor 1108 is connected to the output of the charge pump 1100 in order to receive VERA. The lower variable resistor 1110 is connected to ground. The voltage at Node A is thus determined by the ratio of the resistance of the lower variable resistor 1110 to the total resistance of the upper variable resistor 1108 plus the lower variable resistor 1110.

The voltage divider network 1106 may have other configurations than the one depicted in FIG. 11. The upper variable resistor 1108 may more generally be referred to as an upper leg of the network 1106, and the lower variable resistor 1110 may more generally be referred to as a lower leg of the network 1106. It is not required that both the upper leg and the lower leg comprise variable resistances. For example, one of the legs might have a fixed resistance. Also, there may be more than two legs in the voltage divider network 1106. For example, the voltage divider network 1106 could have another resistor (within another leg) in series with upper variable resistor 1108 and lower variable resistor 1110.

In one embodiment, the NAND string 1120 resides in a 3D memory array. In one embodiment, the NAND string 1120 has a configuration such as depicted in FIG. 4. However, note that the NAND string 1120 could have more or fewer word lines than depicted in FIG. 4. With reference now to the NAND string 1120, since VERA is applied to the bit line it is therefore applied to the drain of the SGD transistor 680. V_GIDL1 is applied to the control gate of the SGD transistor 680. The combination of VERA and V_GIDL1 causes a GIDL current at the drain end of the NAND string (I_GIDL_dr). Because VERA is applied to the source line it is therefore applied to the drain of the SGS transistor 670. V_GIDL2 is applied to the control gate of the SGS transistor. The combination of VERA and V_GIDL2 causes a GIDL current at the source end of the NAND string (I_GIDL_src). Many other NAND strings may also undergo a GIDL erase at the same time. To not obscure the diagram, these other NAND strings are not depicted in FIG. 11. However, VERA is shown as being applied to other bit lines (BL) to represent that other NAND strings are also being erased. Hence, other NAND strings will also have an I_GIDL_dr and an I_GIDL_src. The total GIDL current of all the NAND strings undergoing GIDL erase is referred to in FIG. 11 as I_GIDL. The current I_GIDL is provided by the charge pump 1100. The current from the charge pump 1100 may be somewhat larger than I_GIDL due to the leakage current (I_Leak).

Figure 12:
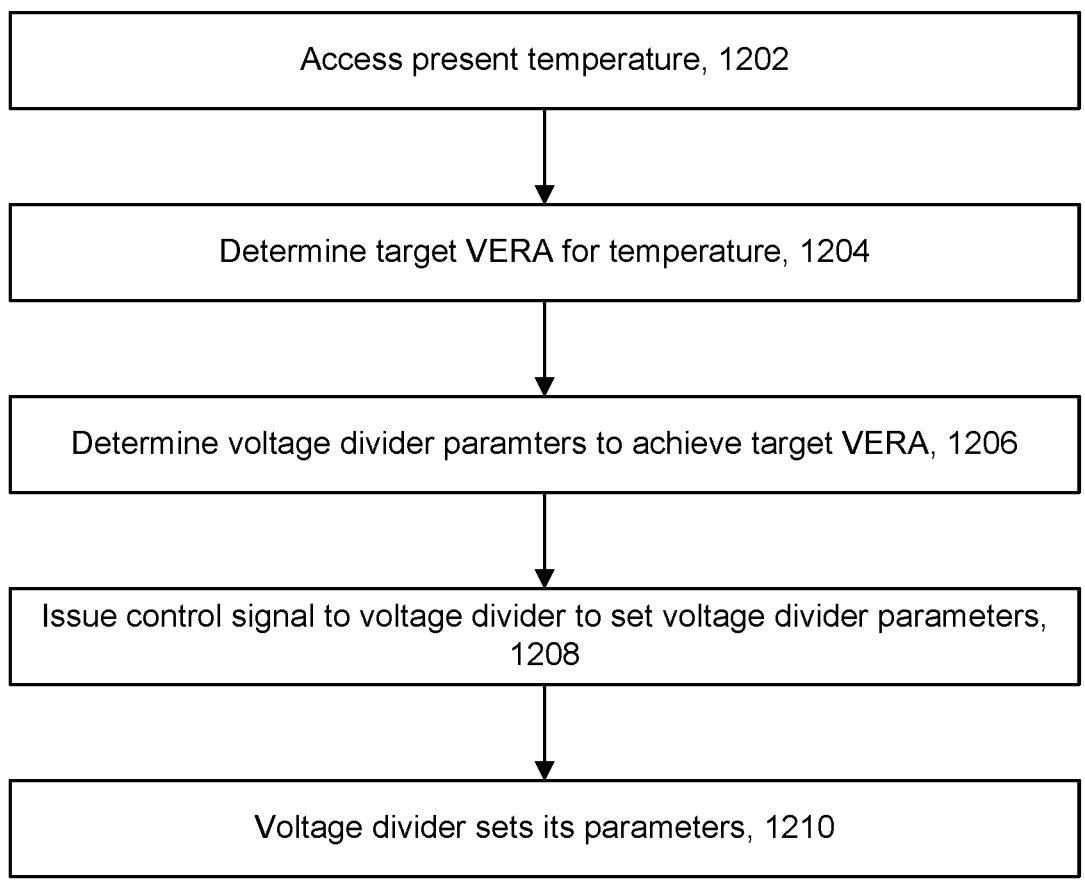
FIG. 12 depicts a flowchart of one embodiment of a process of providing a temperature dependent erase voltage.

FIG. 12 depicts a flowchart of one embodiment of a process 1200 of providing a temperature dependent erase voltage. Reference will be made to FIG. 11 when discussing process 1200, but process 1200 is not limited to FIG. 11.

Step 1202 includes accessing a present temperature. The temperature sensor 134 on the memory die 108 may be used to access the present temperature. The present temperature may be referred to as a present operating temperature.

Step 1204 includes determining a target VERA for the present temperature. Step 1204 may use Equation 1, which was discussed above in the discussion of FIG. 9. The default VERA is the value that would otherwise be used if no temperature compensation is used. Equation 1 describes one technique for determining a target VERA based on a default VERA. The exact form of the Equation and its parameters may vary depending on the temperature compensation that is selected. In some embodiments, the target VERA is accessed from a table, whose values may be based on an equation such as Equation 1. Other techniques may be used to determine the target VERA. In one embodiment, the state machine 112 determines the target VERA.

Step 1206 includes determining voltage divider parameters to achieve the target VERA. The voltage divider parameters will determine what proportion of VERA appears at Node A. For example, the values of the resistances of upper variable resistor 1108 and lower variable resistor 1110 may be determined. In one embodiment, the state machine 112 determines the voltage divider parameters.

Step 1208 includes issuing a control signal to the voltage divider 1106 to set the voltage divider parameters. The signal may be sent by the state machine 112.

Step 1210 includes the voltage divider 1106 setting its parameters. For example, the resistances of upper variable resistor 1108 and/or lower variable resistor 1110 are set.

Figure 13:
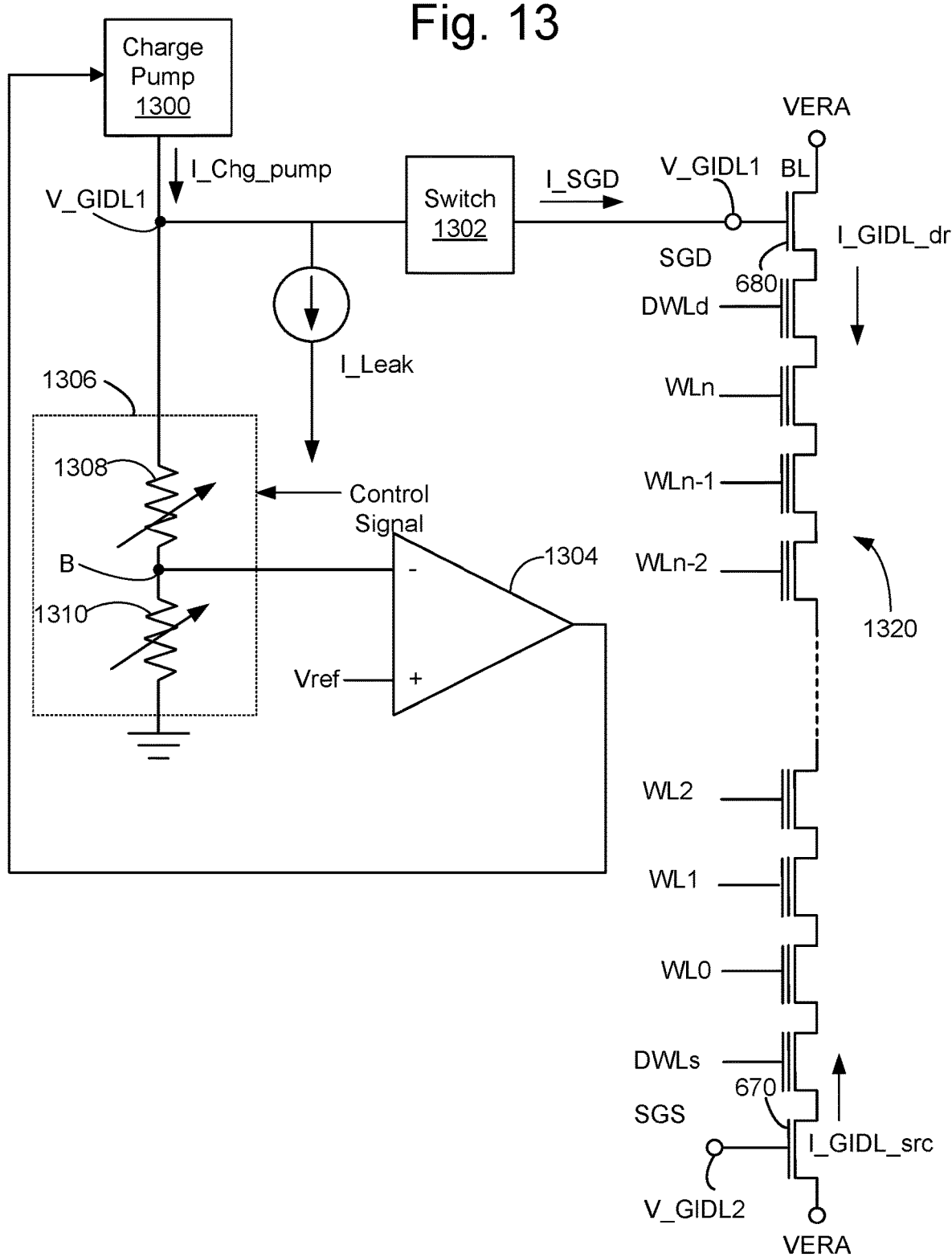
FIG. 13 is a diagram of one embodiment of a system configured to apply a temperature dependent erase voltage to a drain side select transistor on a NAND string.

In some embodiments, a temperature dependent erase voltage is applied to select lines connected to select transistors on NAND strings. FIG. 13 is a diagram of one embodiment of a system configured to apply a temperature dependent erase voltage to a drain side select transistor on a NAND string 1320. A similar system may be used to apply a temperature dependent erase voltage to a source side select transistor on a NAND string. The components in FIG. 13 may reside within memory system 100. In one embodiment, the components in FIG. 13 reside on memory die 108. In one embodiment, the NAND string resides in a 3D memory array. The system includes a charge pump 1300, a switch 1302, a voltage regulator 1304, and a voltage divider 1306. In one embodiment, the charge pump 1300, voltage regulator 1304 and voltage divider 1306 reside in the HV GEN 772 (see FIG. 7).

The charge pump 1300 is configured to output an erase voltage (V_GIDL1). The charge pump 1300 is connected to a switch 1302 in order to deliver V_GIDL1 to the control gate of the drain side select transistor 680 on the NAND string 1320. Note that V_GIDL1 may also be provided to other NAND strings. VERA is applied to the bit line (BL). In one embodiment, VERA is temperature dependent. For example, the system in FIG. 11 could be used to provide a temperature dependent VERA to the BL. In one embodiment, VERA is temperature independent.

The charge pump 1300 provides a current I_Chg_pump. In one embodiment, I_Chg_pump is equal to I_SGD plus I_Leak. I_SGD is the total current provided to the SGD line. The current I_Leak represents a leakage current along the path of delivering V_GIDL1 from the charge pump 1300 to the NAND strings undergoing GIDL erase.

The voltage regulator 1304 is configured to regulate the voltage V_GIDL1 that is output by the charge pump 1300. The inverting input of the voltage regulator 1304 is connected to Node B in voltage divider network 1306 in order to receive a voltage that is based on V_GIDL1. The voltage at Node B may be referred to as a feedback voltage. The voltage at Node B will be some proportion of V_GIDL1, as will be explained below. The voltage divider network 1306 is configured to change the proportion in response to a control signal, which allows the voltage at Node B to be temperature dependent. The non-inverting input of the regulator 1304 is provided with a reference voltage Vref. The output of the voltage regulator 1304 may be based on a comparison of the voltage a Node B with the reference voltage. The output of the voltage regulator 1304 may be used as a control signal to the charge pump 1300. In this manner V_GIDL1 may be regulated. Moreover, because the voltage at Node B may be controlled to be temperature dependent, V_GIDL1 may therefore be controlled to be temperature dependent.

In one embodiment, voltage divider network 1306 has upper variable resistor 1308 and lower variable resistor 1310. Node B is labeled between the upper variable resistor 1308 and the lower variable resistor 1310. Upper variable resistor 1308 is connected to the output of the charge pump 1300 in order to receive V_GIDL1. The lower variable resistor 1310 is connected to ground. The voltage at Node B is thus determined by the ratio of the resistance of the lower variable resistor 1310 to the total resistance of the upper variable resistor 1308 plus the lower variable resistor 1310.

The voltage divider network 1306 may have other configurations than the one depicted in FIG. 13. The upper variable resistor 1308 may more generally be referred to as an upper leg of the network 1306, and the lower variable resistor 1310 may more generally be referred to as a lower leg of the network 1306. It is not required that both the upper leg and the lower leg comprise variable resistances. Also, there may be more than two legs in the voltage divider network 1306. For example, the voltage divider network 1306 could have another resistor in series with upper variable resistor 1308 and lower variable resistor 1310.

In one embodiment, the NAND string 1320 resides in a 3D memory array. In one embodiment, the NAND string 1320 has a configuration such as depicted in FIG. 4. However, note that the NAND string 1320 could have more or fewer word lines than depicted in FIG. 4. With reference now to the NAND string 1320, since VERA is applied to the bit line it is therefore applied to the drain of the SGD transistor 680. V_GIDL1 is applied to the control gate of the SGD transistor 680. The combination of VERA and V_GIDL1 causes a GIDL current at the drain end of the NAND string (I_GIDL_dr). Because VERA is applied to the source line it is therefore applied to the drain of the SGS transistor 670. V_GIDL2 is applied to the control gate of the SGS transistor 670. In one embodiment, V_GIDL2 is temperature dependent. The combination of VERA and V_GIDL2 causes a GIDL current at the source end of the NAND string (I_GIDL_src). Many other NAND strings may also undergo a GIDL erase at the same time. To not obscure the diagram, these other NAND strings are not depicted in FIG. 13. Hence, other NAND strings will also have an I_GIDL_dr and an I_GIDL_src. Unlike the charge pump 1100 in the system of FIG. 11, charge pump 1300 does not provide the GIDL current to the NAND strings. In one embodiment, the charge pump 1100 in the system in FIG. 11 is used to provide VERA to the bit lines and the source line for NAND string 1320 (as well as other NAND strings being erased). Hence, the charge pump 1100 may be used to supply the GIDL current.

FIG. 14 depicts a flowchart of one embodiment of a process 1400 of providing a temperature dependent erase voltage. The erase voltage may be V_GIDL1 or V_GIDL2. Reference will be made to FIG. 13 when discussing process 1400, but process 1400 is not limited to FIG. 13.

Step 1402 includes accessing a present temperature. The temperature sensor 134 on the memory die 108 may be used to access the present temperature. The present temperature may be referred to as a present operating temperature.

Step 1404 includes determining a target GIDL erase voltage ΔGIDL. Recall that ΔGIDL is the difference between VERA and V_GIDL. Equation 2 is one technique for calculating the target ΔGIDL.

$$\Delta GIDL = \Delta GIDL_{DEFAULT}(1 + f2*(85 - \text{temp})) \quad \text{(Eq. 2)}$$

In Equation 2, $\Delta GIDL_{DEFAULT}$ is the value for ΔGIDL if temperature compensation were not being used. That is, temperature compensation is not being used for either VERA or V_GIDL. An example of $\Delta GIDL_{DEFAULT}$ is 12V. In Equation 2, f2 is a parameter, which may be accessed from storage on the memory die 108. In Equation 2, temp is the present temperature, which may be expressed in degrees Celsius. This is the temperature that was accessed in step 1402. In some embodiments, the target ΔGIDL is accessed from a table, whose values may be based on an equation such as Equation 2. Other techniques may be used to determine the target ΔGIDL. In one embodiment, the state machine 112 determines the target ΔGIDL.

Step 1406 includes determining a target V_GIDL in order to achieve the target ΔGIDL. In other words, step 1406 includes a determination of the select line voltage to achieve the GIDL erase voltage. This determination may be based on VERA. In one embodiment, Equation 3 is used to determine the target V_GIDL.

$$V\_GIDL_{TAR} = VERA_{TAR} - \Delta GIDL_{TAR} \quad \text{(Eq. 3)}$$

In Equation 3, $V\_GIDL_{TAR}$ is the target V_GIDL, $VERA_{TAR}$ is the target VERA, and $\Delta GIDL_{TAR}$ is the target ΔGIDL. The target VERA could be temperature dependent or temperature independent. In one embodiment, Equation 1 is used to determine the temperature dependent VERA. In some embodiments, the target V_GIDL is accessed from a table, whose values may be based on an equation such as Equation 3. Other techniques may be used to determine the target V_GIDL. In one embodiment, the state machine 112 determines the target V_GIDL.

Step 1408 includes determining voltage divider parameters to achieve the target V_GIDL. For example, the values of the resistances of upper variable resistor 1308 and lower variable resistor 1310 may be determined. In one embodiment, the state machine 112 determines the voltage divider parameters.

Step 1410 includes issuing a control signal to the voltage divider 1306 to set the voltage divider parameters. In one embodiment, the state machine 112 issues the control signal to the voltage divider 1306.

Step 1412 includes the voltage divider 1306 setting the resistances of its resistors. For example, the resistances of upper variable resistor 1308 and/or lower variable resistor 1310 are set.

As noted above, the amount of GIDL current that is generated may be dependent on temperature. For example, at higher temperatures, a given ΔGIDL may generate more GIDL current. In some embodiments, an erase voltage is regulated in order to provide a target GIDL current to NAND strings. This regulation may include sampling a current that is provided to the NAND strings from a high voltage source, such as a charge pump. The sampled current may include the GIDL current provided to all of the NAND strings. The sampled current may also include a leakage current. Hence, the sampled current could be slightly larger than the total GIDL current in all NAND strings under erase. The erase voltage may then be regulated based on the current.

Figure 15:
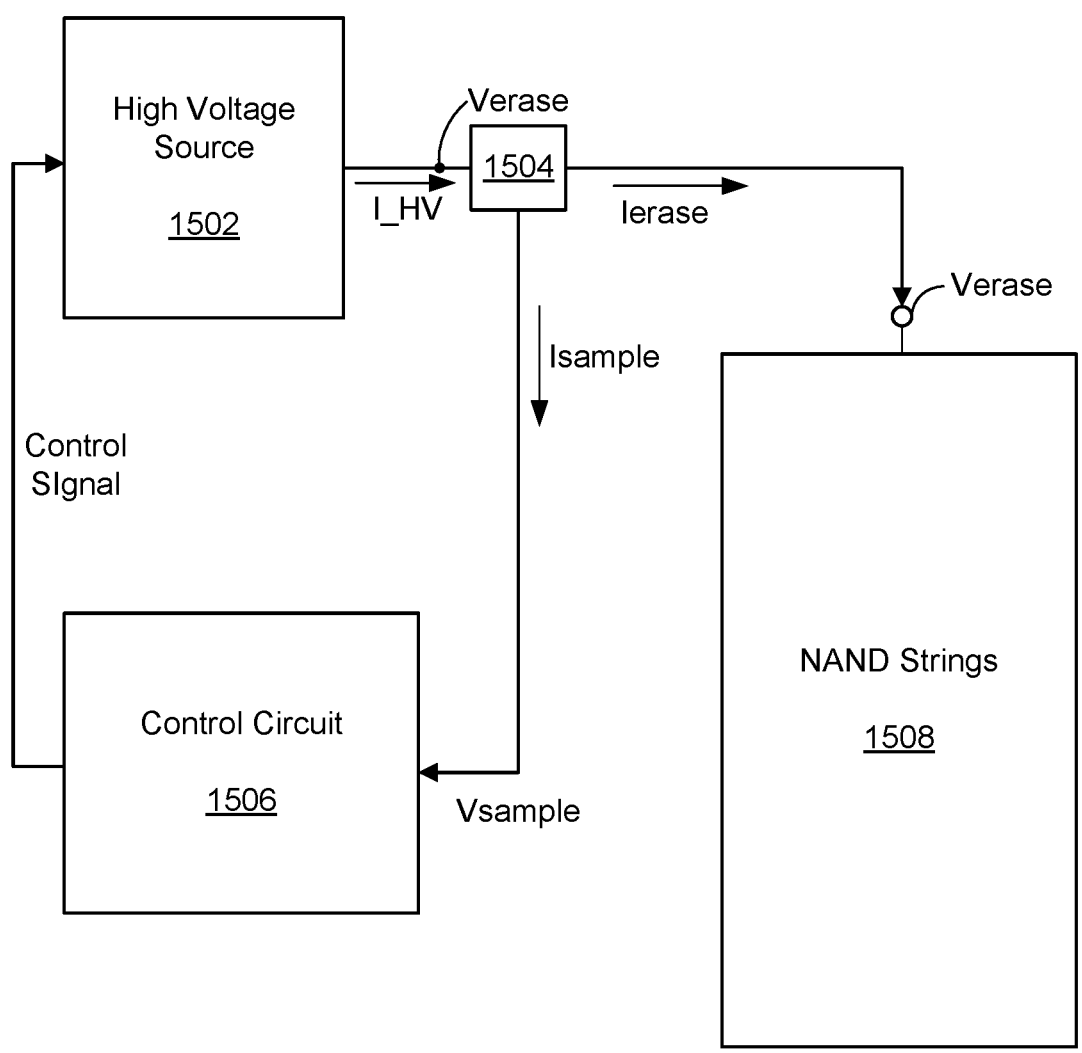
FIG. 15 depicts one embodiment of a system that regulates an erase voltage that is provided to NAND strings.

FIG. 15 depicts a block diagram of one embodiment of a system that regulates an erase voltage that is provided to NAND strings. The components in FIG. 15 may reside within memory system 100. In one embodiment, the components in FIG. 15 reside on memory die 108. In one embodiment, the system is able to provide a GIDL erase current to the NAND strings that is substantially independent of temperature. Therefore, GIDL erase may be consistent across operating temperatures. The regulating may be based on a current that is provided to the NAND strings. In one embodiment, the system provides VERA to the NAND strings. VERA could be provided to bit lines and or a source line (see, for example, FIGS. 8, 11 and 14). In one embodiment, the system provides V_GIDL (e.g., V_GIDL1, V_GIDL2) to the NAND strings. V_GIDL1 and/or V_GIDL2 could be provided to select lines (see, for example, FIGS. 8, 11 and 14).

The high voltage source 1502 outputs an erase voltage (Verase). Verase is provided to the NAND strings. In one embodiment, Verase is VERA, which is provided to bit lines connected to the NAND strings. In one embodiment, Verase is VERA, which is provided to a source line connected to the NAND strings. In one embodiment, Verase is V_GIDL1, which is provided to control gates of SGD transistors on the NAND strings 1508. In one embodiment, Verase is V_GIDL2, which is provided to control gates of SGS transistors on the NAND strings 1508.

The high voltage source 1502 also provides a current I_HV. The erase current Ierase is a current that is provided to the NAND strings 1508. Alternatively, it may be stated that Ierase is the current that is drawn by the NAND strings 1508. Ierase may have about the same magnitude as I_HV. The current Ierase is provided by the high voltage source 1502. The total current I_HV from the high voltage source 1502 may be somewhat higher than Ierase due to a possible leakage current. The leakage current is not depicted in FIG. 15. The high voltage source 1502 may comprise one or more charge pumps.

A current sampler 1504 is configured to sample the current I_HV that is output from the high voltage source 1502. This current may be about equal to Ierase, but there may also be a leakage current component to the current that is output from the high voltage source 1502. The current sampler 1504 provides a sample current Isample to the control circuit 1506. The magnitude of Isample is thus based on Ierase. The current sampler may include a current mirror. Thus, Isample may be some fraction of Ierase. The control circuit 1506 also inputs a sample (Vsample) of the output voltage of the high voltage source 1502. Vsample may be equal to Verase or may be based on Verase.

The control circuit 1506 is configured to regulate the output voltage of the high voltage source 1502 based on Vsample and Isample. A consequence of this regulation is that Ierase may be substantially temperature independent. Recall that GIDL current generation in NAND strings may be strongly temperature dependent, with GIDL current generation being stronger at higher temperature. In the event that GIDL current generation in the NAND strings increases due to higher temperatures, the system may automatically change Verase (e.g., decrease VERA and/or increase V_GIDL) such that ΔGIDL is decreased. Therefore, with a lower ΔGIDL, there will be less GIDL current generation in NAND strings. On the other hand, in the event that GIDL current generation in the NAND strings decreases due to lower temperatures, the system may automatically change Verase (e.g., increase VERA and/or decrease V_GIDL) such that ΔGIDL is increased. Therefore, with a higher ΔGIDL, there will be more GIDL current generation in NAND strings 1508.

Figure 16:
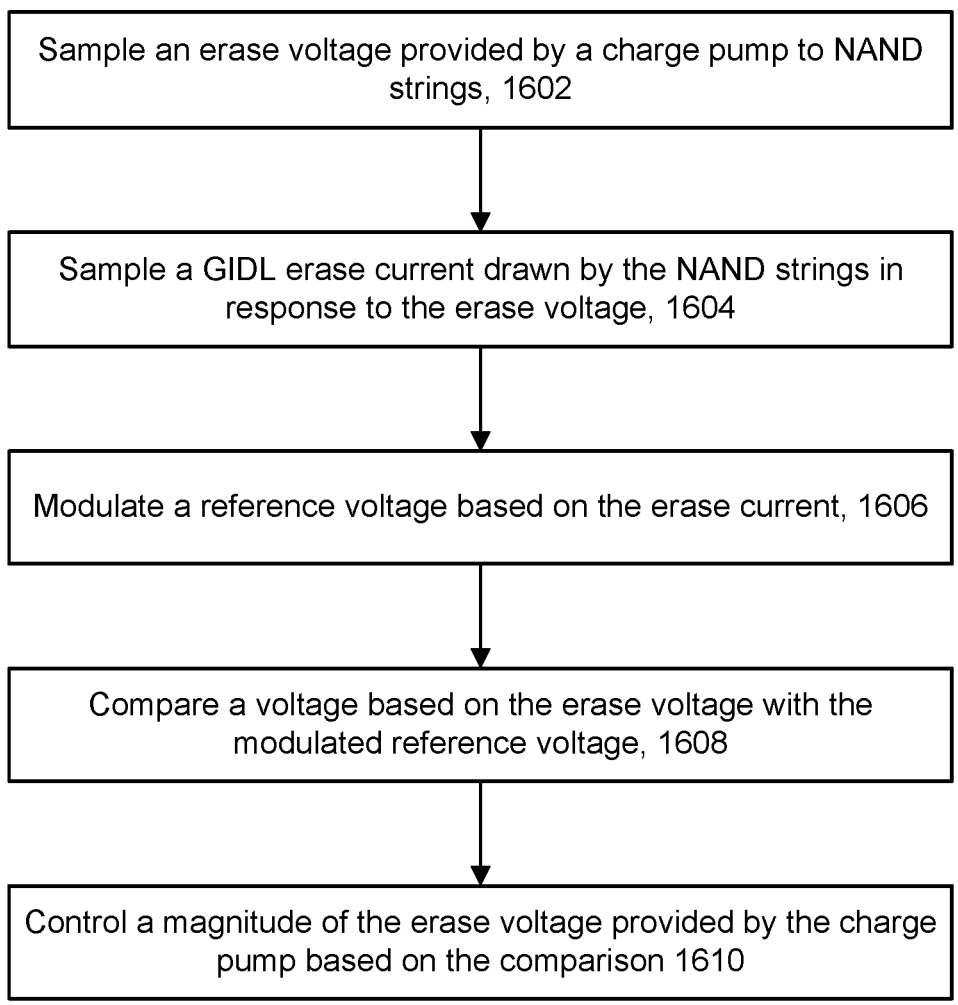
FIG. 16 depicts a flowchart of one embodiment of a process of erasing NAND strings having non-volatile memory cells.

As discussed in connection with FIG. 15, in some embodiments, the memory system regulates an erase voltage based on an erase current that is provided to the NAND strings. In one embodiment, the erase current is used to modulate a reference voltage. The reference voltage is used to regulate the erase voltage. Thus, the erase current may be used to regulate the erase voltage. FIG. 16 depicts a flowchart of one embodiment of a process 1600 of erasing NAND strings in which the erase voltage is regulated based on an erase current.

Step 1602 includes sampling an erase voltage provided by a charge pump to the NAND strings. In one embodiment, the erase voltage includes VERA. VERA may be applied to drain terminals of select transistors of the NAND strings. VERA may be applied to drain terminals of drain side select transistors and/or source side select transistors. VERA may be applied to bit lines connected to the NAND strings and/or to one or more source lines connected to the NAND strings. In one embodiment, the erase voltage includes V_GIDL1 provided to control gates of drain side select transistors of the NAND strings. In one embodiment, the erase voltage includes V_GIDL2 provided to control gates of source side select transistors of the NAND strings.

Step 1604 includes sampling a GIDL erase current drawn by the NAND strings in response to the NAND strings receiving the erase voltage. The GIDL erase current includes the total GIDL current of all NAND strings presently being erased. Sampling the GIDL erase current could also result in sampling a small amount of leakage current. Thus, the phrase, "sampling a gate induced drain leakage (GIDL) erase current drawn by the NAND strings in response to the erase voltage provided to the NAND strings," may include sampling a current that includes the GIDL erase current and a leakage current. Step 1604 may be achieved by sampling a current provided by a charge pump. The current that is provided by the charge pump includes the GIDL erase current, and may also include a leakage current. Step 1604 may include sampling a total GIDL erase current provided to all bit lines connected to the NAND strings undergoing GIDL erase. Step 1604 may include sampling a total GIDL erase current provided to one or more source lines connected to the NAND strings undergoing GIDL erase.

Step 1606 includes modulating a reference voltage based on the GIDL erase current. In one embodiment, the magnitude of the reference voltage is modulated based on the magnitude of the GIDL erase current. In one embodiment, the magnitude of the reference voltage is increased in response to the magnitude of the GIDL erase current being lower than a threshold.

Step 1608 includes comparing a voltage based on the erase voltage with the modulated reference voltage. The voltage that is based on the erase voltage may be a voltage at a node of a voltage divider. In one embodiment, the erase voltage is provided to a voltage divider, such that the voltage that is based on the erase voltage is some proportion of the erase voltage. In one embodiment, a comparator compares the modulated reference voltage to the voltage that is based on the erase voltage.

Step 1610 includes controlling a magnitude of the erase voltage provided by the charge pump based on the comparison of step 1608. In one embodiment, step 1610 includes regulating the magnitude of the erase voltage to achieve a target GIDL erase current. The comparator output may be used to send a control signal to the charge pump. In this manner, the modulated reference voltage may be used to regulate the erase voltage. Since the reference voltage is modulated based on the magnitude of the GIDL erase current, this implies that the magnitude GIDL erase current is may be used to regulate the erase voltage. Thus, temperature sensitivity in the GIDL erase current may be mitigated. In other words, the temperature dependence in the GIDL erase current may be substantially reduced or eliminated.

Figure 17:
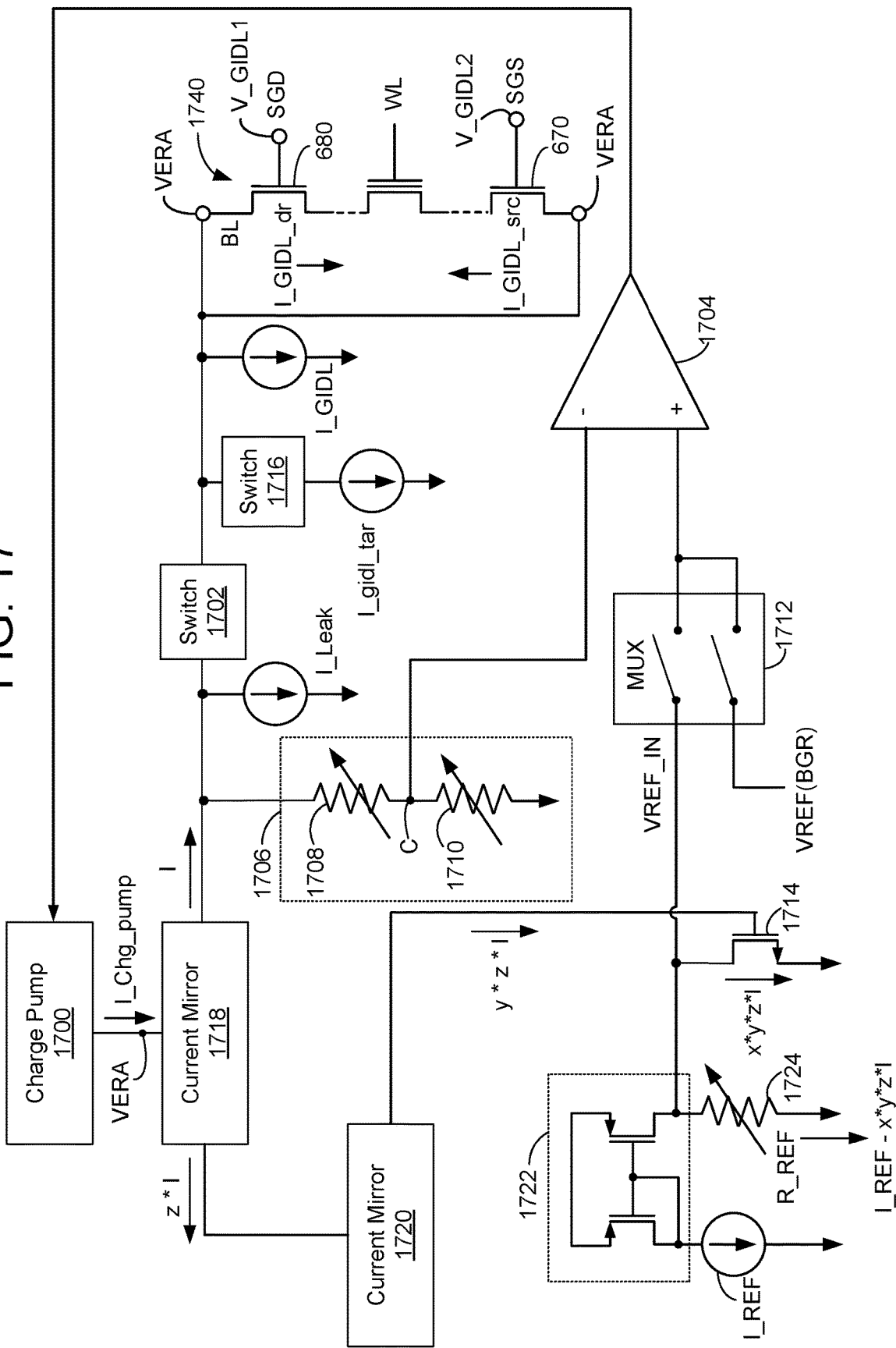
FIG. 17 depicts one embodiment of a control circuit for erasing non-volatile memory cells.

FIG. 17 depicts one embodiment of a system for erasing non-volatile memory cells. The components in FIG. 17 may reside within memory system 100. In one embodiment, the components in FIG. 17 reside on memory die 108. FIG. 17 provides further details of one embodiment in which an erase voltage (VERA) is regulated based on a current that is output from a charge pump 1700. The charge pump 1700 provides a current I_Chg_pump to a first current mirror 1718. The first current mirror 1718 provides a current (I) towards the NAND strings. The current (I) may provide a GIDL erase current (I_GIDL), as well as a leakage current (I_Leak). In one embodiment, I is equal to I_Chg_pump. For the sake of discussion, it will be assumed that I is equal to I_Chg_pump. Thus, the current I_Chg_pump may provide I_GIDL, as well as a I_Leak.

The system is configured to erase non-volatile memory cells on the NAND string 1740. In one embodiment, the NAND string 1740 resides in a 3D memory array. The system also erases non-volatile memory cells on other NAND strings at the same time, using the same erase voltages, but the other NAND strings are not depicted in FIG. 17 so as to not obscure the diagram.

The system includes a charge pump 1700, a switch 1702, a voltage regulator 1704, and a voltage divider 1706. In one embodiment, the charge pump 1700, voltage regulator 1704 and a voltage divider 1706 reside in the HV GEN 772 (see FIG. 7).

The charge pump 1700 is configured to output an erase voltage (VERA). The charge pump 1700 is connected to a switch 1702 in order to deliver VERA to the bit line (BL) connected to NAND string 1740. VERA is also provided to bit lines connected to other NAND strings, but the other bit lines are not depicted in FIG. 17. VERA is also provided to the source line (SL) connected to NAND string 1740. The source line may also be connected to other NAND strings to be erased. There may be other switches in addition to switch 1702 to route the erase voltage (VERA). The current I_Leak represents a leakage current along the path of delivering VERA from the charge pump 1700 to the NAND strings.

The voltage regulator 1704 is configured to regulate the voltage VERA that is output by the charge pump 1700. The inverting input of the voltage regulator 1704 is connected to Node C in voltage divider network 1706 in order to receive a voltage that is based on VERA. The voltage at Node C may be referred to as a feedback voltage. The voltage at Node C will be some proportion of VERA, as will be explained below. In one embodiment, the voltage divider network 1706 is configured to change the proportion in response to a control signal. The inverting input of the regulator 1704 is provided with the voltage from Node C.

The non-inverting input of the regulator 1704 is provided with a reference voltage from the MUX 1712. The MUX 1712 can select between two reference voltages, such that the regulator 1704 is provided with one of the two reference voltages. One of the reference voltages is referred to as VREF(BGR). In one embodiment, the reference voltage VREF(BGR) is a band gap reference voltage. In one embodiment, the reference voltage VREF(BGR) does not vary with temperature (e.g., is temperature independent). In one embodiment, the reference voltage VREF(BGR) is provided to the regulator 1704 during a calibration mode.

The other reference voltage is referred to as VREF_IN. In one embodiment, the reference voltage VREF_IN is modulated by modulating device 1714. The control gate of the modulating device 1714 receives a current that is based on the current that is output by the charge pump 1700, which allows the reference voltage VREF_IN to be modulated by the current output by the charge pump 1700. In one embodiment, modulating the reference voltage VREF_IN based on the current output by the charge pump 1700 allows the system to achieve a target erase current in the NAND strings. In one embodiment, the reference voltage VREF_IN is provided to the regulator 1704 during a normal mode of operation in which the NAND string 1740 and other NAND strings are being erased.

The output of the voltage regulator 1704 may be based on a comparison of the voltage a Node C with the reference voltage provided by the MUX 1712. The output of the voltage regulator 1704 is provided as a control signal to the charge pump 1700. In this manner VERA may be regulated.

With reference now to the NAND string 1740, since VERA is applied to the bit line it is therefore applied to the drain of the SGD transistor 680. V_GIDL1 is applied to the control gate of the SGD transistor 680. The combination of VERA and V_GIDL1 causes a GIDL current at the drain end of the NAND string (I_GIDL_dr). Because VERA is applied to the source line it is therefore applied to the drain of the SGS transistor 670. V_GIDL2 is applied to the control gate of the SGS transistor. The combination of VERA and V_GIDL2 causes a GIDL current at the source end of the NAND string (I_GIDL_src). Many other NAND strings may also undergo a GIDL erase at the same time. Hence, other NAND strings will also have an I_GIDL_dr and an I_GIDL_src. The total GIDL current of all the NAND strings undergoing GIDL erase is referred to in FIG. 17 as I_GIDL. Thus, I_GIDL represents the total GIDL current in all NAND strings being erased. The current I_GIDL is provided by the charge pump 1700. There may be a leakage current I_Leak as well. The current I_Leak represents the leakage current while the NAND strings are being erased. In one embodiment, the current (I_Chg_pump) from the charge pump 1700 is equal to I_GIDL plus I_Leak.

FIG. 17 also shows a target GIDL current labeled as I_gidl_tar, which is a target total GIDL current for all NAND strings that will undergo erase using VERA from the charge pump 1700. The target GIDL current I_gidl_tar is used during the calibration mode. The target GIDL current is connected to the charge pump 1700 through both switch 1702 and switch 1716. Switch 1716 is closed during the calibration mode in order to connect the target GIDL current I_gidl_tar to the charge pump 1700. The target GIDL current I_gidl_tar is not used during the normal mode when the NAND strings are being erased. Thus, the switch 1716 may open and/or the target GIDL current I_gidl_tar may be inactive during the normal mode.

Next, details of how the reference voltage VREF_IN is modulated based on the current (I) output by the charge pump 1700 will be discussed. A first current mirror 1718 that is connected to the charge pump 1700 samples the current (I) from the charge pump 1700. First current mirror 1718 provides current (I) towards the NAND strings as a GIDL erase current. First current mirror 1718 provides a current, which is labeled as z*I, to a second current mirror 1720. That is, the current has a magnitude of z*I. Here, "z" could be smaller than "1", equal to "1", or larger than "1". Second current mirror 1720 is connected to the control gate of the modulating device 1714, such that second current mirror 1720 provides a current to the control gate of the modulating device 1714. This current is labeled as y*z*I. Here, "y" could be smaller than "1", equal to "1", or larger than "1".

A third current mirror 1722 is connected to a reference current I_REF. The third current mirror 1722 is also connected to a variable resistor R_REF 1724. The current that flows through variable resistor R_REF is I_REF−x*y*z*I.

The reference voltage VREF_IN given by Equation 4.

$$V\_REF\_IN = R\_REF * (I\_REF - (x*y*z*I))\qquad\text{Eq. 4}$$

Thus, the reference voltage VREF_IN may be modulated based on the current (I) from the charge pump 1700.

As noted above, the system may have a calibration mode. The calibration mode may be used to establish parameters for the voltage divider 1706. For example, the resistances of resistor 1708 and resistor 1710 may be established. The values of the resistances of resistor 1708 and resistor 1710 are established in order to achieve a target VERA. The calibration mode may also be used to establish the resistance of variable resistor 1724.

The following describes how the system may be operated during the calibration mode. During a first portion of the calibration mode, the MUX 1712 is used to select reference voltage VREF(BGB). Switch 1716 is closed and the GIDL target current I_gidl_tar is active. As noted above, the GIDL target current I_gidl_tar is the target GIDL current for all NAND strings to be erased. However, note that the NAND strings are not erased during the calibration mode. Thus, the GIDL target current I_gidl_tar may serve to replicate the current drawn by the NAND strings during GIDL erase.

During the calibration mode, the charge pump 1700 is operated such that the charge pump outputs VERA, as well as the current (I_Chg_pump). The regulator 1704 compares the voltage at Node C with reference voltage VREF(BGB) and outputs a control signal to the charge pump 1700. Therefore, VERA that is output by the charge pump 1700 is established based on the voltage at Node C. As noted above, the calibration mode may be used to establish VERA at a target magnitude. To do so, the values of resistors 1708 and 1710 may be adjusted to control the voltage at Node C. In one embodiment, the ratio of the resistance of resistor 1708 to the resistance of resistor 1710 is established in order reach the target VERA.

Resistor 1724 may also be trimmed during the calibration mode. When trimming resistor 1724, the MUX 1712 selects reference voltage VREF_IN. Switch 1716 is closed and the GIDL target current I_gidl_tar is active. The regulator 1704 compares the voltage at Node C with reference voltage VREF_IN and outputs a control signal to the charge pump 1700. Therefore, VERA that is output by the charge pump 1700 is established based on the voltage at Node C. Now the value of resistor 1724 may be adjusted to control the reference voltage VREF_IN in order reach the target VERA.

In some embodiments, resistor 1724 is trimmed once during the calibration, without the need to trim resistor 1724 again. In other embodiments, resistor 1724 may be trimmed during the lifetime of the memory system. In one embodiment, resistor 1724 is trimmed in response to the operating temperature changing by more than a threshold. A factor in whether resistor 1724 is trimmed in response to changes in operating temperature is the significance of the leakage current I_Leak. If the leakage current I_Leak is relatively small, then there may be no need to trim resistor 1724 in response to temperature changes. However, if the leakage current I_Leak is significant, then the resistor 1724 may be trimmed in response to temperature changes. Therefore, temperature dependent impact of the leakage current I_Leak may be mitigated.

Note that changing the resistance of resistor 1724 may change the magnitude of the reference voltage VREF_IN (see Equation 4 above). Hence, in one embodiment, the memory system modifies the resistance of resistor 1724 based on temperature, which in turn adjusts the magnitude of VREF_IN based on temperature. Providing for a temperature dependent VREF_IN may mitigate temperature dependent leakage current (I_Leak).

Figure 18:
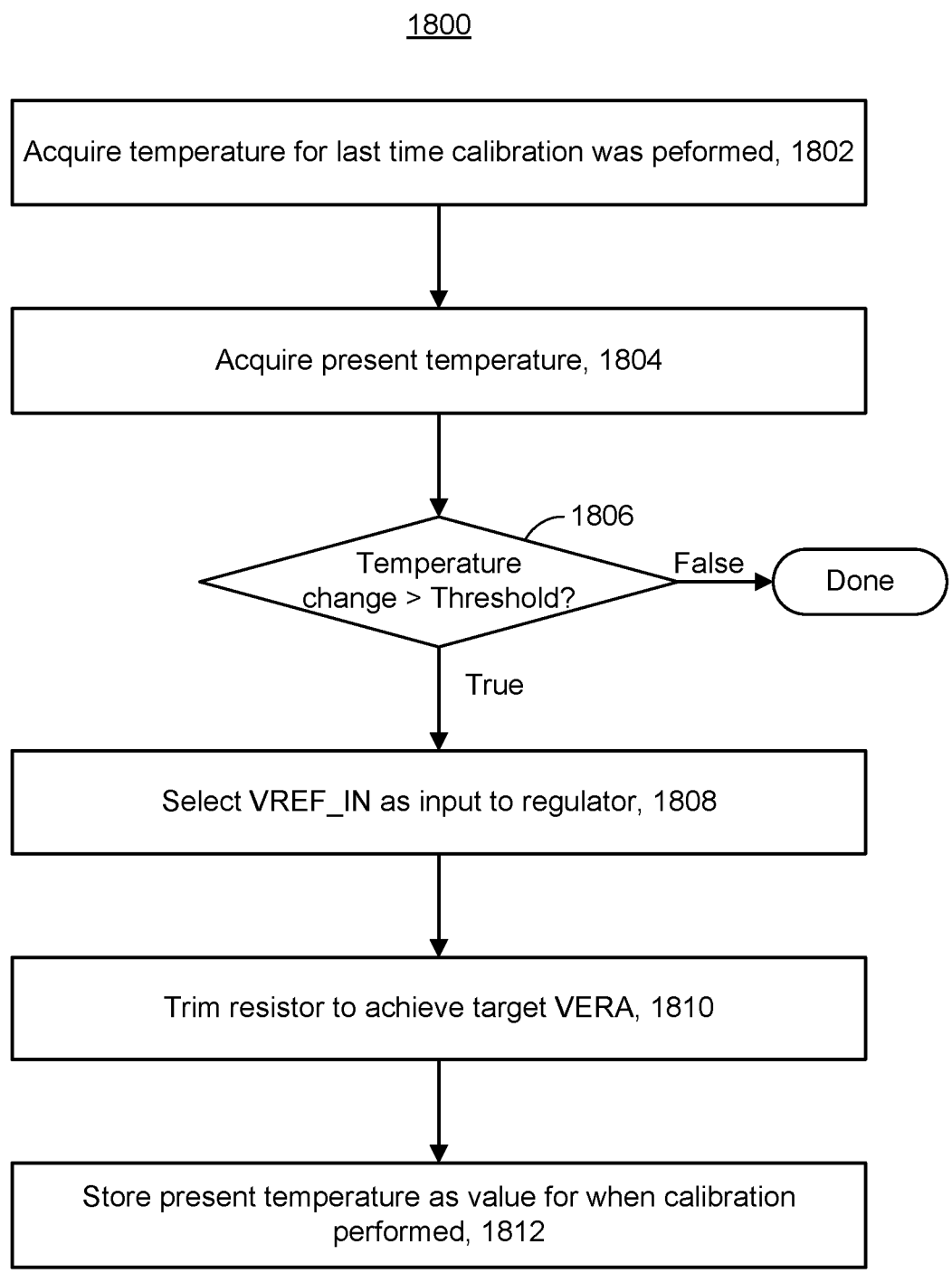
FIG. 18 depicts a flowchart of one embodiment of a process of trimming a resistor based on temperature to achieve a target erase voltage.

FIG. 18 depicts a flowchart of one embodiment of a process 1800 of trimming resistor 1724 based on temperature. Process 1800 thus allows the resistance of resistor 1724 to be temperature dependent. Thus, process 1800 provides for a temperature dependent VREF_IN. Recall that VREF_IN may be modulated by the current from the charge pump. Hence, process 1800 allows the reference volt VREF_IN to be modulated by an amount that depends on temperature. Moreover, process 1800 may mitigate temperature dependent leakage current (I_Leak). Step 1802 is to access a temperature for the last time that resistor 1724 was trimmed. In the event that the memory system is just being powered on, this value will be null.

Step 1804 includes accessing a present operating temperature of the memory system.

Step 1806 includes comparing the present operating temperature with the temperature at which resistor 1724 was last trimmed. If the temperature change is greater than a threshold (e.g., 10 degrees C.), then control passes to step 1808 to trim resistor 1724. Note that if the memory system is just being powered on, then control will pass to step 1808. In the event that the temperature change is not greater than the threshold, then the process 1800 concludes.

Step 1808 includes selecting the VREF_IN as the reference voltage to be input to the regulator 1704. MUX 1712 may be used to select VREF_IN as the reference voltage. In one embodiment, switch 1716 is closed and the target GIDL current I_gidl_tar is active.

Step 1810 includes trimming resistor 1724 in order to achieve a target VERA. The charge pump 1700 outputs VERA and regulator 1704 control the charge pump 1700, as has been described in the discussion of FIG. 17.

Step 1812 includes storing the present temperature as the value for most recent time that resistor 1724 was trimmed. Thus, process 1800 may be used to mitigate the impact of I_leak over a wide temperature range.

A first embodiment disclosed herein includes an apparatus comprising NAND strings comprising non-volatile memory cells, a voltage source configured to output an erase voltage, and a control circuit in communication with the NAND strings and the voltage source. The control circuit is configured to provide the erase voltage to the NAND strings. The control circuit is configured to sense a current provided by the voltage source in response to the erase voltage provided to the NAND strings. The control circuit is configured to regulate the voltage source based on the current provided by the voltage source.

In a second embodiment, in furtherance of the first embodiment, the control circuit comprises a voltage regulator coupled to the voltage source. The voltage regulator is configured to control the voltage source based on a reference voltage. The control circuit is further configured to modulate the reference voltage based on the current from the voltage source in order to regulate the voltage source.

In a third embodiment, in furtherance of the second embodiment, the control circuit is further configured to modulate the reference voltage by an amount that depends on temperature.

In a fourth embodiment, in furtherance of any of the first to third embodiments, the control circuit is further configured to regulate a magnitude of the erase voltage to achieve a target GIDL erase current in the NAND strings.

In a fifth embodiment, in furtherance of any of the first to fourth embodiments, the apparatus further comprises a plurality of bit lines. Each bit line is connected to one of the NAND strings. The control circuit is configured to provide the erase voltage to the bit lines.

In a sixth embodiment, in furtherance of any of the first to fifth embodiments, the apparatus further comprises one or more source lines connected to the NAND strings. The control circuit is configured to provide the erase voltage to the one or more source lines.

In a seventh embodiment, in furtherance of any of the first to sixth embodiments, the apparatus further comprises a select line connected to a select transistor on each NAND string. The control circuit is configured to provide the erase voltage to the select line.

In an eighth embodiment, in furtherance of any of the first to seventh embodiments, the control circuit is configured to use the erase voltage to perform a gate induced drain leakage (GIDL) erase of the NAND strings.

In a ninth embodiment, in furtherance of any of the first to eighth embodiments, the NAND strings reside in a three-dimensional memory array.

One embodiment includes a method of erasing non-volatile storage. The method comprise sampling an erase voltage provided by a charge pump to NAND strings comprising non-volatile memory cells. The method comprises sampling a gate induced drain leakage (GIDL) erase current drawn by the NAND strings in response to the erase voltage provided to the NAND strings. The method comprises modulating a reference voltage based on the GIDL erase current. The method comprises comparing a voltage based on the erase voltage with the modulated reference voltage. The method comprises controlling a magnitude of the erase voltage provided by the charge pump based on the comparison.

One embodiment includes a non-volatile memory system comprising NAND strings comprising non-volatile memory cells, a voltage generation circuit and a control circuit. The voltage generation circuit comprises a charge pump configured to output an erase voltage, a voltage divider coupled to the charge pump, and a regulator coupled to the node of the voltage divider and to the charge pump. The voltage divider is configured to receive the erase voltage from the charge pump. The voltage divider has a node that provides a feedback voltage that is a proportion of the erase voltage. The voltage divider is configured to change the proportion. The regulator is configured to input a reference voltage and the feedback voltage. The regulator is configured to output a control signal to the charge pump based on a comparison of the reference voltage with the feedback voltage in order to regulate a magnitude of the erase voltage. The control circuit is configured to control the proportion of the erase voltage at the node based on temperature. The control circuit is further configured to apply the erase voltage from the charge pump to the NAND strings.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   NAND strings comprising non-volatile memory cells;
   a voltage source configured to output an erase voltage;
   a voltage regulator coupled to the voltage source, the voltage regulator configured to regulate the voltage source based on a comparison of a reference voltage and a voltage based on the erase voltage; and
   a control circuit in communication with the NAND strings, the voltage source and the voltage regulator, the control circuit configured to:
   provide the erase voltage to the NAND strings;
   sense a current provided by the voltage source in response to the erase voltage provided to the NAND strings; and
   modulate the reference voltage based on the current from the voltage source.

2. The apparatus of claim 1, wherein the control circuit is further configured to modulate the reference voltage by an amount that depends on temperature.

3. The apparatus of claim 1, wherein the control circuit is further configured to:
   regulate a magnitude of the erase voltage to achieve a target GIDL erase current in the NAND strings.

4. The apparatus of claim 1, further comprising:
   a plurality of bit lines, each of the bit lines connected to one of the NAND strings, wherein the control circuit is configured to provide the erase voltage to the bit lines.

5. The apparatus of claim 1, further comprising:
   one or more source lines connected to the NAND strings, wherein the control circuit is configured to provide the erase voltage to the one or more source lines.

6. The apparatus of claim 1, further comprising:
   a select line connected to a select transistor on each NAND string, wherein the control circuit is configured to provide the erase voltage to the select line.

7. The apparatus of claim 1, wherein the control circuit is configured to use the erase voltage to perform a gate induced drain leakage (GIDL) erase of the NAND strings.

8. The apparatus of claim 1, wherein the NAND strings reside in a three-dimensional memory array.

9. A method of erasing non-volatile storage, the method comprising:
   sampling an erase voltage provided by a charge pump to NAND strings comprising non-volatile memory cells;
   sampling a magnitude of a gate induced drain leakage (GIDL) erase current drawn by the NAND strings in response to the erase voltage provided to the NAND strings;
   controlling a magnitude of a reference voltage based on the magnitude of the sampled GIDL erase current;
   comparing a voltage based on the erase voltage with the magnitude controlled reference voltage; and
   controlling a magnitude of the erase voltage provided by the charge pump based on the comparison.

10. The method of claim 9, wherein controlling the magnitude of the erase voltage provided by the charge pump based on the comparison comprises:
    regulating the magnitude of the erase voltage to provide a target GIDL erase current to the NAND strings.

11. The method of claim 9, wherein controlling the magnitude of the erase voltage provided by the charge pump based on the comparison comprises:
    increasing the magnitude of the erase voltage in response to a lower GIDL erase current.

12. The method of claim 9, wherein sampling the magnitude of the GIDL erase current drawn by the NAND strings in response to the erase voltage provided to the NAND strings comprises:
    sampling a total current provided to all bit lines connected to the NAND strings.

13. The method of claim 12, wherein sampling the magnitude of the GIDL erase current drawn by the NAND strings in response to the erase voltage provided to the NAND strings further comprises:
    sampling a total current provided to one or more source lines connected to the NAND strings.

14. A non-volatile memory system comprising:
NAND strings comprising non-volatile memory cells;
a voltage generation circuit comprising:
- a charge pump configured to output an erase voltage;
- a voltage divider coupled to the charge pump, the voltage divider configured to receive the erase voltage from the charge pump, the voltage divider having a node that provides a feedback voltage that is a proportion of the erase voltage; and
- a regulator coupled to the node of the voltage divider and to the charge pump, the regulator configured to input a reference voltage and the feedback voltage, the regulator configured to output a control signal to the charge pump based on a comparison of the reference voltage with the feedback voltage in order to regulate a magnitude of the erase voltage; and
- a control circuit configured to apply the erase voltage from the charge pump to the NAND strings, the control circuit further configured to control a magnitude of the reference voltage based on a current in the NAND strings that results from the erase voltage applied to the NAND strings.

15. The non-volatile memory system of claim 14, further comprising:
- a plurality of bit lines, each of the bit lines connected to one of the NAND strings, wherein the control circuit is configured to apply the erase voltage from the charge pump to the bit lines in order to apply the erase voltage from the charge pump to the NAND strings; and
- a source line connected to the NAND strings, wherein the control circuit is configured to apply the erase voltage from the charge pump to the source line in order to apply the erase voltage from the charge pump to the NAND strings.

16. The non-volatile memory system of claim 15, wherein the control circuit is further configured to:
- decrease a magnitude of the erase voltage at high temperature relative to a magnitude of a default erase voltage that is temperature independent.

17. The non-volatile memory system of claim 15, wherein the control circuit is further configured to:
- increase a magnitude of the erase voltage at low temperature relative to a magnitude of a default erase voltage that is temperature independent.

18. The non-volatile memory system of claim 14, further comprising:
- a select line connected to a select transistor on each of the NAND strings, wherein the control circuit is configured to apply the erase voltage from the charge pump to the select line in order to apply the erase voltage from the charge pump to the NAND strings.

19. The non-volatile memory system of claim 14, wherein the control circuit is further configured to apply the erase voltage from the charge pump to the NAND strings in order to perform a gate induced drain leakage (GIDL) erase the non-volatile memory cells on the NAND strings.

* * * * *